(12) United States Patent
Liikanen et al.

(10) Patent No.: US 11,361,825 B2
(45) Date of Patent: Jun. 14, 2022

(54) DYNAMIC PROGRAM ERASE TARGETING WITH BIT ERROR RATE

(71) Applicant: Micron Technology, Inc., Boise, ID (US)

(72) Inventors: Bruce A. Liikanen, Berthoud, CO (US); Michael Sheperek, Longmont, CO (US); Larry J. Koudele, Erie, CO (US)

(73) Assignee: Micron Technology, Inc., Boise, ID (US)

(*) Notice: Subject to any disclaimer, the term of this patent is extended or adjusted under 35 U.S.C. 154(b) by 363 days.

(21) Appl. No.: 16/719,745

(22) Filed: Dec. 18, 2019

(65) Prior Publication Data

US 2021/0193229 A1     Jun. 24, 2021

(51) Int. Cl.

| | |
|---|---|
| *G11C 16/14* | (2006.01) |
| *G11C 16/12* | (2006.01) |
| *G11C 16/34* | (2006.01) |
| *G06F 11/07* | (2006.01) |
| *G11C 11/56* | (2006.01) |
| *G11C 16/04* | (2006.01) |

(52) U.S. Cl.
CPC ............ *G11C 16/14* (2013.01); *G06F 11/076* (2013.01); *G06F 11/0727* (2013.01); *G11C 16/12* (2013.01); *G11C 16/3459* (2013.01); *G11C 11/5635* (2013.01); *G11C 11/5671* (2013.01); *G11C 16/0483* (2013.01)

(58) Field of Classification Search
CPC ..... G11C 16/14; G11C 16/12; G11C 16/3459; G11C 11/5635; G11C 11/5671; G11C 16/0483; G11C 29/021; G11C 29/028; G11C 29/4401; G11C 29/52; G11C 16/10; G11C 16/3404; G11C 29/42; G06F 11/0727; G06F 11/076; G06F 11/1048
USPC ..................................... 711/103; 365/185.24
See application file for complete search history.

(56) References Cited

U.S. PATENT DOCUMENTS

| | | | |
|---|---|---|---|
| 8,862,969 B2 | 10/2014 | Liikanen et al. | |
| 9,058,878 B2* | 6/2015 | Aritome | G11C 11/5642 |
| 9,128,858 B1* | 9/2015 | Micheloni | G06F 11/1048 |
| 9,251,909 B1* | 2/2016 | Camp | G06F 3/0655 |
| 9,378,809 B1* | 6/2016 | Srinivasan | G11C 11/5628 |
| 10,140,040 B1 | 11/2018 | Koudele et al. | |
| 11,016,693 B2* | 5/2021 | Pletka | G06F 3/0653 |

(Continued)

*Primary Examiner* — Michael T Tran
(74) *Attorney, Agent, or Firm* — Lowenstein Sandler LLP

(57) ABSTRACT

A system includes a memory array with memory cells and a processing device coupled thereto. The processing device performs program targeting operations that include to: determine a set of difference error counts corresponding to programming distributions of the memory array; identify, based on a comparison of the set of difference error counts, valley margins corresponding to the programming distributions; select, based on values of the valley margins, a program targeting rule from a set of rules; perform, based on the program targeting rule, a program targeting operation to adjust a voltage level associated with an erase distribution of the memory array; determine a bit error rate (BER) of the memory array; in response to the BER satisfying a BER control value, reduce the voltage level by a voltage step; and in response to the BER not satisfying the BER control value, increase the voltage level by the voltage step.

20 Claims, 11 Drawing Sheets

(56) References Cited

U.S. PATENT DOCUMENTS

| | | | |
|---|---|---|---|
| 2010/0332923 A1* | 12/2010 | D'Abreu | G11C 16/349 714/752 |
| 2012/0051138 A1* | 3/2012 | Kim | H01L 27/11556 365/189.05 |
| 2012/0275232 A1* | 11/2012 | Park | G11C 16/0483 365/185.24 |
| 2013/0083600 A1* | 4/2013 | Lee | G11C 16/0483 365/185.11 |
| 2014/0063938 A1* | 3/2014 | Oh | G11C 16/3418 365/185.11 |
| 2014/0063955 A1* | 3/2014 | Kawase | G11C 16/3454 365/185.12 |
| 2014/0115410 A1* | 4/2014 | Kealy | G06F 11/00 714/704 |
| 2014/0208174 A1* | 7/2014 | Ellis | G06F 11/1048 714/721 |
| 2014/0310445 A1* | 10/2014 | Fitzpatrick | G06F 12/0246 711/103 |
| 2015/0117107 A1* | 4/2015 | Sun | G11C 11/5635 365/185.12 |
| 2015/0170749 A1* | 6/2015 | Park | G11C 16/16 365/185.05 |
| 2016/0041760 A1* | 2/2016 | Kuang | G11C 16/3495 711/103 |
| 2016/0077903 A1* | 3/2016 | Reddy | G06F 11/0727 714/704 |
| 2020/0202938 A1* | 6/2020 | Reina | G11C 16/349 |
| 2020/0210259 A1* | 7/2020 | Hoei | G11C 16/3431 |

* cited by examiner

700

```
┌─────────────────────────────────────────────────┐
│ Preset, to higher than a default value, a voltage level of an │
│ erase distribution of a memory array, the memory array │
│ including memory cells of a first logical page type and of a │
│ second logical page type. 710 │
└─────────────────────────────────────────────────┘
                          ↓
┌─────────────────────────────────────────────────┐
│ Determine a set of difference error counts corresponding to │
│ programming distributions of the first logical page type. 720 │
└─────────────────────────────────────────────────┘
                          ↓
┌─────────────────────────────────────────────────┐
│ Identify, based on a comparison of the set of difference │
│ error counts, valley margins corresponding to the │
│ programming distributions. 730 │
└─────────────────────────────────────────────────┘
                          ↓
┌─────────────────────────────────────────────────┐
│ Adjust, multiple times, a value of at least some of the valley │
│ margins to equalize relative valley margins of the first logical │
│ page type such that read window budgets (RWB) for valleys │
│ of the first logical page type are approximately the same │
│ RWB. 740 │
└─────────────────────────────────────────────────┘
                          ↓
┌─────────────────────────────────────────────────┐
│ Determine a bit error rate (BER) of the memory array. 750 │
└─────────────────────────────────────────────────┘
                          ↓
              ╱ BER satisfy BER ╲
        Yes ╱  control value?    ╲ No
           ╱         760           ╲
          ↓                         ↓
┌──────────────────┐        ┌──────────────────┐
│ Reduce the voltage│        │ Increase the voltage│
│ level by a voltage step.│  │ level by a voltage step.│
│ 765 │                      │ 770 │
└──────────────────┘        └──────────────────┘
                          ↓
              ╱ Reach an ╲
             ╱ equilibrium in voltage ╲ No
             ╲ level? 775 ╱
                          ↓ Yes
              ┌────────────────────────┐
              │ Dither voltage level by │
              │ the voltage step. 780 │
              └────────────────────────┘
```

FIG. 7

DYNAMIC PROGRAM ERASE TARGETING WITH BIT ERROR RATE

TECHNICAL FIELD

Embodiments of the disclosure relate generally to memory sub-systems, and more specifically, relate to dynamic program erase targeting with bit error rate.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 7 is a flow diagram of an example method for execution of a memory quality test using one or more read voltage levels according to additional embodiments.

DETAILED DESCRIPTION

Figure 1A:
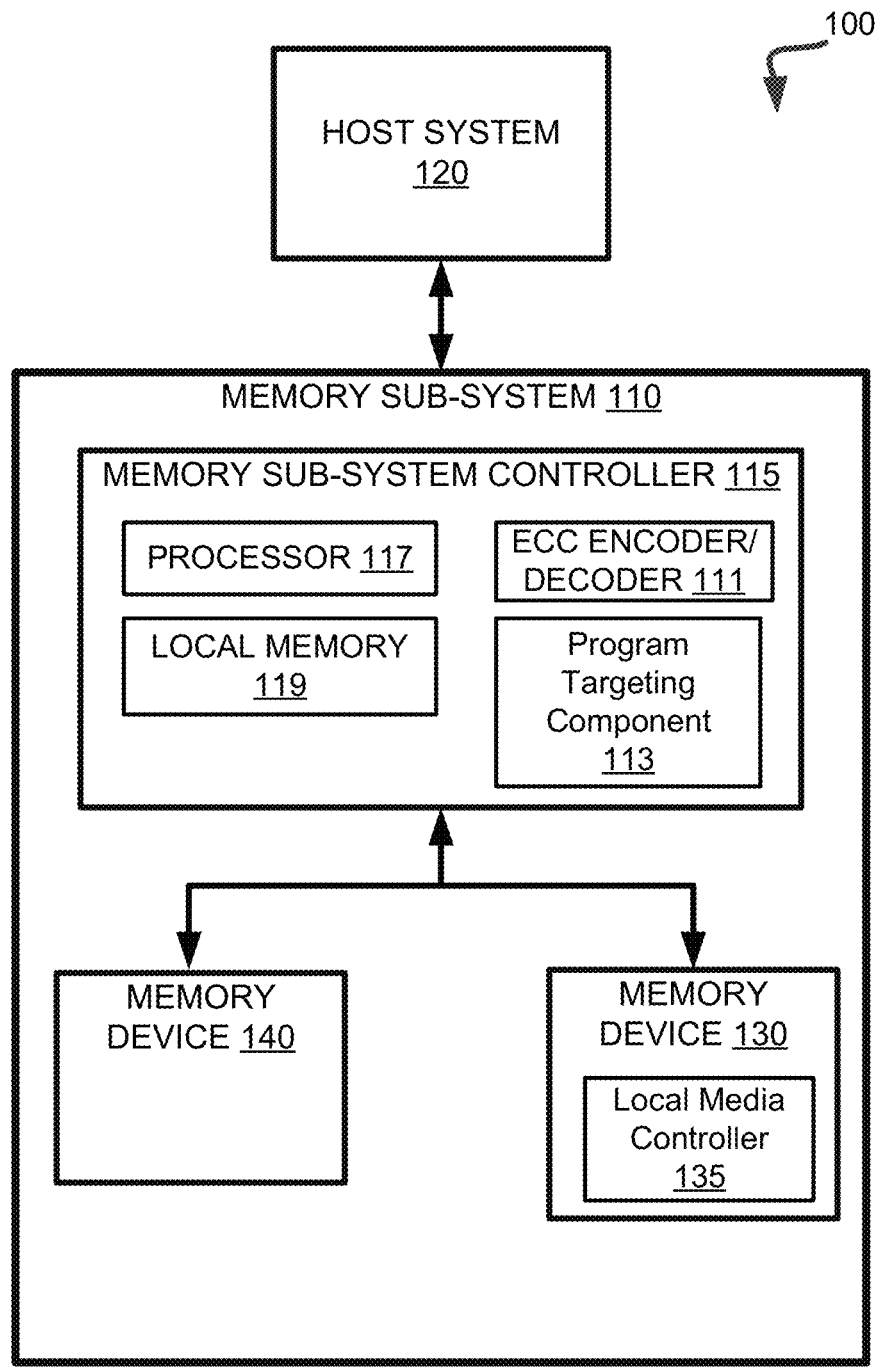
FIG. 1A illustrates an example computing system that includes a memory sub-system in accordance with some embodiments.

Aspects of the present disclosure are directed to read voltage-assisted manufacturing tests in memory sub-systems. A memory sub-system can be a storage device, a memory module, or a hybrid of a storage device and memory module. Examples of storage devices and memory modules are described below in conjunction with FIGS. 1A-1B. In general, a host system can utilize a memory sub-system that includes one or more memory components, such as memory devices that store data. The host system can provide data to be stored at the memory sub-system and can request data to be retrieved from the memory sub-system.

The memory sub-system can include multiple memory devices, which in turn include a memory array of memory cells, that can store data from the host system in accordance with multiple programming distributions. A continuous read level calibration (cRLC) operation continuously samples margins between programming distributions, also referred to as read threshold valleys, or more simply, valleys. This valley margin can refer to a relative width between pairs of adjacent programming distributions. Valley margin can be correlated with a read window budget (RWB). Read window budget for a valley can refer to an absolute measurement in volts (e.g., millivolts (mV)) between two adjacent programming distributions.

Conventional memory sub-systems experience wear which causes an imbalance in the bit error rate (BER) between logical page types. The BER can be calculated from the number of bit errors detected in an error correction code (ECC) codeword divided by the total number of bits in the codeword. The calculated BER can include the bit error count of a single codeword, the average (mean or median) of many codewords, or can include only the codewords of a specific page or page type. The imbalance in BER between page types causes an increase in an average error correction trigger rate throughout the life of each die, including bringing end-of-life (EOL) conditions sooner due to a logical page type becoming dominant. In addition, the BER imbalance can result in a different RWB for the valleys of each logical page type, causing a decrease in endurance (e.g., fewer total Program/Erase cycles) for each die in a memory sub-system.

Aspects of the present disclosure address the above and other deficiencies by performing cRLC measurements for use with various types of program targeting operations (also referred to herein as Dynamic Program Targeting (DPT) operations). A program targeting (PT) operation controls the program verify (PV) target (e.g., a threshold voltage (Vt)) placement such that the programming distributions are placed in a beneficial arrangement. A PV target can refer to voltage value or trim value used to program a memory cell at a given voltage level. The PV target can set a threshold voltage (Vt) of the memory cell, e.g., a minimum voltage at which a memory cell turns on or is conductive. The position of the erase programming distribution (i.e., L0) can be controlled (e.g., moved right or left) by adjusting the voltage of the erase (also referred to as "vera") to adjust the margin of a valley between the erase distribution and a first programming distribution (i.e., the L1 distribution). The erase programming distribution is also referred to more simply as the erase distribution.

In various embodiments, the erase distribution is controlled through a quality feedback metric, which can be bit error rate (BER) of the memory sub-system in on example, e.g., which may be tested at a memory array level. In disclosed embodiments, the dynamic program erase targeting (DPET) based on BER (or DPET_BER) is configured to lower the erase distribution voltage level in response to higher BER signals and increase the erase distribution voltage level in response to lower BER signals. This feedback control can be driven by a certain BER control value that is compared against the current BER of the memory array for purposes of making adjustments a voltage step at a time (higher or lower). After adjusting the voltage level of erase distribution to an equilibrium, the control system can dither the voltage level by plus or minus one voltage step during subsequent DPET_BER adjustment loops. In one embodiment, the BER control value is set as a percentage above the baseline BER of the memory sub-system, where the baseline BER is based on factory default trim values.

Advantages of the present disclosure include, but are not limited to, controlling the PV target placement and the voltage of the erase programming distribution to improve the measured BER, trigger rate, trigger rate margin and read window budget (RWB) associated with a memory sub-system. According to embodiments, a lowest programming distribution and a highest distributions move along with the erase distribution to enable utilizing the full available RWB (e.g., across all valleys). In addition, allowing all of the programming distributions to move in a controlled manner results in an adjustment to the total RWB from the erase distribution to the highest programming distribution to take advantage of die-to-die variations for optimal placements rather than a fixed window placement of conventional memory sub-systems.

Further by way of advantage, moving the erase distribution to a higher voltage can result in improved endurance capability. And, moving the erase distribution to a lower voltage can result in improved margin to read error, temperature, program disturbances, read disturbances, and defects. Additionally, a programmable control point (e.g., the BER control value) allows different die in the same product to be set for different characteristics, e.g., some die can be set for improved endurance capability while other die are set for improved margins. A programmable control point in system product manufacturing can allow the same product to be manufactured with different endurance and margin characteristics, e.g., where customer A desires a high endurance product and customer B requires a high margin product.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and a non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, "coupled to" or "coupled with" generally refers to a connection between components or devices, which can be an indirect communicative connection or direct communicative connection (e.g., without intervening components or devices), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point type and NAND are described, the memory device 130 can be based on any other type of non-volatile memory, such as read-only memory (ROM), phase change memory (PCM), self-selecting memory, other chalcogenide based memories, ferroelectric random access memory (Fe-RAM), magneto random access memory (MRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

In some embodiments, the controller 115 includes an error-correcting code (ECC) encoder/decoder 111 and a program targeting component 113. The ECC encoder/decoder 111 can perform ECC encoding for data written to the memory devices 130 and ECC decoding for data read from the memory devices 130, respectively. The ECC decoding can be performed to decode an ECC codeword to correct errors in the raw read data, and in many cases also to report the number of bit errors in the raw read data.

Figure 1B:
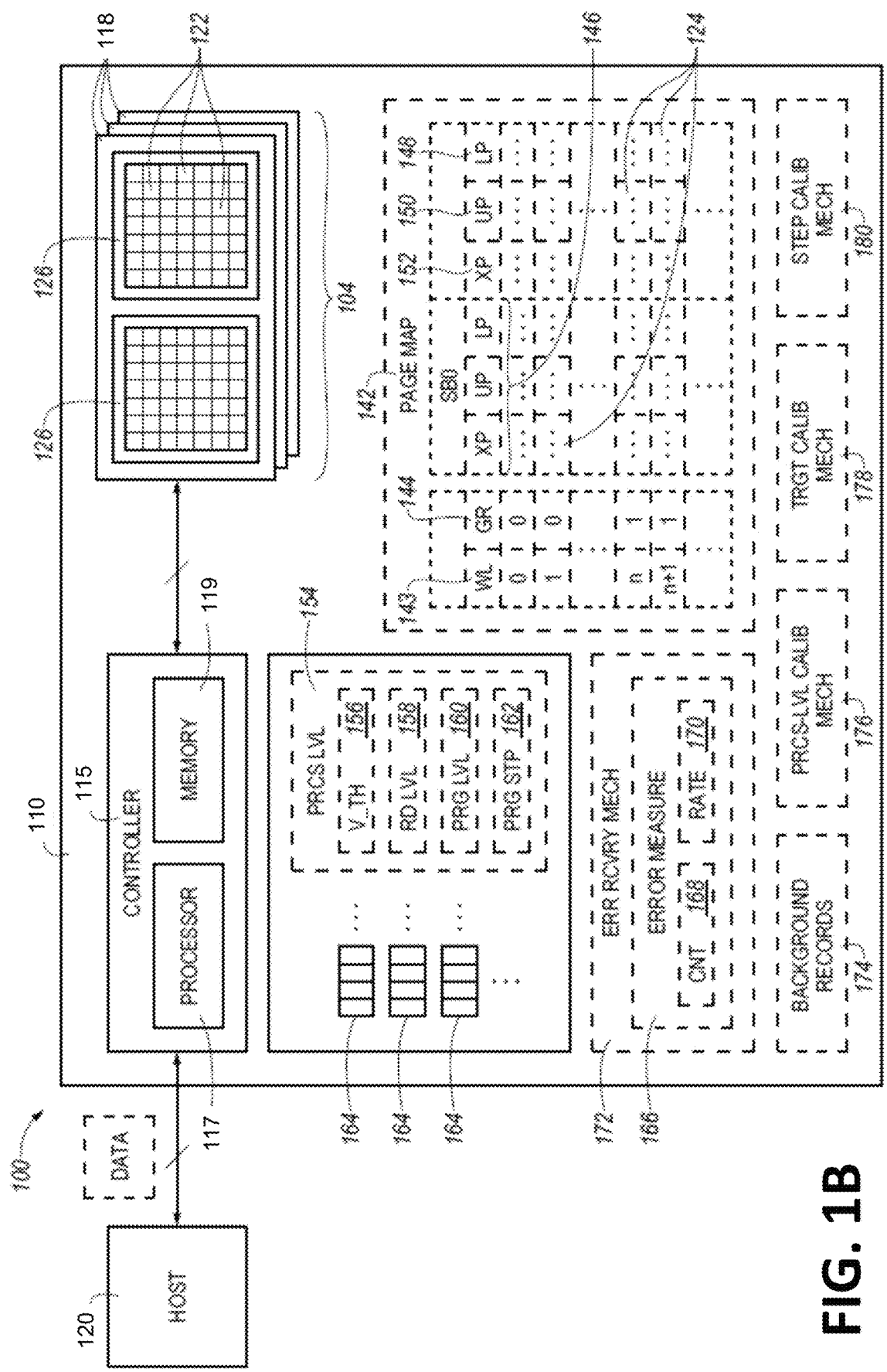
FIG. 1B is a block diagram of a memory sub-system with a dynamic programming calibration mechanism configured in accordance with various embodiments.

In various embodiments, the memory sub-system 110 includes the program targeting component 113 that performs operations as described herein, including with reference to FIG. 1B. In some embodiments, the program targeting component 113 can be part of host system 120, controller 115, memory device 130 or 140, an operating system, or an application. Program targeting component 113 can program the PV targets of one or more programming distributions (e.g., the second programming distribution, the last programming distribution, or both). For example, the controller 115 can include a processor 117 (processing device) configured to execute instructions stored in local memory 119 for performing the operations described herein.

In some embodiments, the controller 115 includes at least a portion of the program targeting component 113. Further, the controller 115 can include the processor 117 (processing device) configured to execute instructions stored in local memory 119 for performing the operations described herein. In some embodiments, the program targeting component 113 is part of the host system 120, an application, or an operating system.

FIG. 1B is a block diagram of the memory sub-system 110 (FIG. 1A) with a dynamic programming calibration mechanism configured in accordance with various embodiments. As shown, the memory sub-system 110 can include a memory array 104 (e.g., NAND flash, or other memory type of the memory devices 130 and/or 140) and the controller 115. The memory sub-system 110 can operably couple the memory array 104 to the host system 120 (e.g., an upstream central processor (CPU)). The memory array 104 can include circuitry configured to store data in the memory array 104 and provide access to data in the memory array 104.

In various embodiments, the memory array 104 can be provided as semiconductor, integrated circuits and/or external removable devices in computers or other electronic devices. The memory array 104 includes a plurality of memory regions, or memory units 118. The memory units 118 can be individual memory dies, memory planes in a single memory die, a stack of memory dies vertically connected with through-silicon vias (TSVs), or the like. In one embodiment, each of the memory units 118 can be formed from a semiconductor die and arranged with other memory unit dies in a single device package (not shown). In other embodiments, one or more of the memory units 118 can be co-located on a single die and/or distributed across multiple device packages. The memory sub-system 110 and/or the individual memory units 118 can also include other circuit components (not shown), such as multiplexers, decoders, buffers, read/write drivers, address registers, data out/data in registers, etc., for accessing and/or programming (e.g., writing) the data and other functionality, such as for processing information and/or communicating with the controller 115.

Each of the memory units 118 includes an array of memory cells 122 that each store data in a charge storage structure. The memory cells 122 can include, for example, floating gate, charge trap, phase change, ferroelectric, magnetoresistive, and/or other suitable storage elements configured to store data persistently or semi-persistently. The memory cells 122 can be one-transistor memory cells that can be can be programmed to a target state to represent information. For instance, electric charge can be placed on, or removed from, the charge storage structure (e.g., the charge trap or the floating gate) of the memory cell 122 to program the cell to a particular data state. The stored charge on the charge storage structure of the memory cell 122 can indicate a threshold voltage (Vt) of the cell. For example, a single level cell (SLC) can be programmed to a targeted one of two different data states, which can be represented by the binary units 1 or 0.

Some memory cells can be programmed to a targeted one of more than two data states. For example, a memory cell that can be programmed to any one of four states (e.g., represented by the binary 00, 01, 10, 11) can be used to store two bits of data, and may be referred to as a multilevel cell (MLC). Still other flash memory cells can be programmed to any one of eight data states (e.g., 000, 001, 010, 011, 100, 101, 110, 111), permitting the storage of three bits of data in a single cell. Such cells may be referred to as triple level cells (TLC). Even higher number of data states are possible, such as those found in quad level cells (QLC), which can be programmed to any one of 16 data states (e.g., 0000, 0001, 0010, 0011, 0100, 0101, 0110, 0111, 1000, 1001, 1010, 1011, 1100, 1101, 1110, 1111) for storing four bits of data. The memory cells 122 capable of storing higher numbers of data states can provide higher density memories without increasing the number of memory cells, since each cell can represent more than one digit (e.g., more than one bit).

The memory cells 122 can be arranged in rows (e.g., each corresponding to a word line 143) and columns (e.g., each corresponding to a bit line). Each word line 143 can include one or more memory pages 124, depending upon the number of data states the memory cells 122 of that word line 143 are configured to store. For example, a single word line of the memory cells 122 that are each configured to store one of two data states (e.g., SLC memory cells configured to store one bit each) can include a single memory page 124. Alternatively, a single word line 143 of the memory cells 122 that are each configured to store one of four data states (e.g., MLC memory cells configured to store two bits each) can include two memory pages 124. Moreover, within the word line 143, pages 124 can be interleaved so that the word line 143 of memory cells 122 that are each configured to store one of two data states (e.g., SLC memory cells) can include two pages, in an "even-odd bit line architecture" (e.g., where all the memory cells 122 in odd-numbered columns of a single word line 143 are grouped as a first page, and all the memory cells 122 in even-numbered columns of the same word line 143 are grouped as a second page). When even-odd bit line architecture is utilized in the word line 143 of memory cells 122 that are each configured to store larger numbers of data states (e.g., memory cells configured as MLC, TLC, QLC, etc.), the number of pages per word line 143 can be even higher (e.g., 4, 6, 8, etc.). Each column can include a string of series-coupled memory cells 122 coupled to a common source. The memory cells 122 of each string can be connected in series between a source select transistor (e.g., a field-effect transistor) and a drain select transistor (e.g., a field-effect transistor). Source select transistors can be commonly coupled to a source select line, and drain select transistors can be commonly coupled to a drain select line.

The memory sub-system 110 can process data using different groupings of the memory cells 122. For example, the memory pages 124 of the memory cells 122 can be grouped into memory blocks 126. In operation, the data can be written or otherwise programmed (e.g., erased) with regards to the various memory regions of the memory sub-system 110, such as by writing to groups of pages 124 and/or memory blocks 126. In NAND-based memory, a write operation often includes programming the memory cells 122 in selected memory pages 124 with specific data values (e.g., a string of data bits having a value of either logic 0 or logic 1). An erase operation is similar to a write operation, except that the erase operation re-programs an entire memory block 126 or multiple memory blocks 126 to the same data state (e.g., logic 0).

In other embodiments, the memory cells 122 can be arranged in different types of groups and/or hierarchies than shown in the illustrated embodiments. Further, while shown in the illustrated embodiments with a certain number of memory cells, rows, columns, blocks, and memory units for purposes of illustration, in other embodiments, the number of memory cells, rows, columns, blocks, and memory units can vary, and can be larger or smaller in scale than shown in the illustrated examples. For example, in some embodiments, the memory sub-system 110 can include only one memory unit 118. Alternatively, the memory sub-system 110 can include two, three, four, eight, ten, or more (e.g., 16, 32, 64, or more) memory units 118. While the memory units 118 are shown in FIG. 1B as including two memory blocks 126 each, in other embodiments, each memory unit 118 can include one, three, four eight, or more (e.g., 16, 32, 64, 100, 128, 256 or more memory blocks). In some embodiments, each memory block 123 can include, e.g., 215 memory pages, and each memory page within a block can include, e.g., 212 memory cells 122 (e.g., a "4 k" page).

In the illustrated example, further organization or details of the memory array 104 is represented with a page map 142. The page map 142 can represent groupings, addresses, types, or a combination thereof for the memory pages 124 for each of the memory blocks 126. For example, each of the memory blocks 126 can include the memory pages 124 corresponding to a word-line group 144. Also, for example, the memory pages 124 can further correspond to a logical page type 146, such as a lower page (LP) 148, an upper page (UP) 150, or an extra page (EP) 152.

The word-line group 144 can include a grouping of the memory pages 124 corresponding to one or more word lines 143 used to implement processing functions, such as read or write for the data. The word-line group 144 can be a grouping of the memory pages 124 for or connected to the word line 143. The word line 143 can correspond to physical layout or architecture of the memory cells 122.

The page type 146, such as for the upper page 150, the lower page 148, and the extra page 152, can represent a grouping of bits in a specific order for the memory pages 124. The types of pages can correspond to a logical layout, architecture, or value for the memory cells 122. For example, the lower page 148 can represent a first information bit stored in the memory pages 124 or the memory cells 122 therein. The lower page 148 can be for SLC type of cells, MLC type of cells, TLC type of cells, or a combination thereof. Also for example, the upper page 150 can correspond to or represent a second information bit stored in the memory pages 124 or the memory cells 122 therein. The upper page 150 can be for the TLC or MLC types of the memory cells 122. Also for example, the extra page 152 can represent a third information bit, such as for the most significant bit or the least significant bit, stored in the memory pages 124 or the memory cells 122 therein. The extra page 152 can be for the TLC type of the memory cells 122.

The memory sub-system 110 can use processing levels 154 for storing or accessing data. The processing levels 154 can include thresholds or operating levels for voltage or current. The processing levels 154 can include a threshold voltage 156, a read level voltage 158, a programming level voltage 160, a programming voltage step 162 (also called voltage step for ease of reference), or a combination thereof. A voltage step may also be referred to a voltage trim level. The threshold voltage 156 can be the voltage applied to the control gate at which the circuitry for the memory cells 122 becomes conductive and a current can be measured. The threshold voltage 156 can be affected and controlled by controlling an amount of charge held in a floating gate or charge trap of the memory cells 122. The memory sub-system 110 can store an amount of charge into the memory cells 122 based on the programming level voltage 160 to represent a corresponding data value. The memory sub-system 110 applies the programming level voltage 160 to control gate or word line to charge up the floating gate or the charge trap. The floating gate or the charge trap can be electrically isolated, which can enable the memory cell to store and hold the charge.

The memory sub-system 110 can use the stored charge to represent data. For example, storing charges on the floating gate or the charge trap can be for storing bit value of 0 for SLC type cells. Bit value of 1 can correspond to the floating gate or the charge trap with no stored charge for the SLC. In other types of cells, such as for MLC, TLC, or QLC, the memory sub-system 110 can store specific amounts of charge on the floating gate or the charge trap to represent different bit values. The MLC type of cell can have four different charge states, TLC can have eight different charge states, and QLC can have 16 different charge states. Each of the charge states can correspond to a unique binary value as discussed above.

The memory sub-system 110 can read or determine data values stored in the memory cells 122 using the read level voltage 158 corresponding to the data value. The memory sub-system 110 can apply the read level voltage 158 to the control gate and measure the current or the voltage across the memory cell to read the data stored in the cell. The charges stored in the floating gate or the charge trap can screen off or offset the amount of charge placed on control gate for reading or accessing the stored data. As such, with the read level voltage 158 applied, the measured current or the voltage across the memory cell will correspond to the amount of charges stored in the floating gate or the charge trap.

During operation of the memory sub-system 110, electrical characteristics of the device (i.e. charge retention capabilities) can change due to repeated data writes, erase, and/or reads. The repeated data operations can lead to breakdown or wearing of the structure electrically isolating the floating gate or the charge trap (e.g. the oxide layers). In accounting for the changing electrical characteristics of the memory cells 122, the memory sub-system 110 can shift or calibrate the read level voltage 158.

The programming level voltage 160 is associated with the read level voltage 158 and the threshold voltage 156. The programming level voltage 160, the read level voltage 158, the threshold voltage 156 or a combination thereof can correspond to the number of bits stored in the memory cells 122, the specific content value of the data stored in the memory cells 122, or a combination thereof.

For example, memory cells 122 configured to store charge in one of two possible states (e.g., SLC memory cells) can have associated programming levels, read levels and threshold voltages that are different from those used with of memory cells 122 configured to store charge in one of four possible states (e.g., MLC memory cells) or memory cells 122 configured to store charge in one of eight possible states (e.g., TLC memory cells). For each type of memory cell (e.g., SLC, MLC, TLC, QLC, etc.), a specific value of the programming level voltage 160, the read level voltage 158, the threshold voltage 156, or a combination thereof can be associated with each of the possible data values.

The memory sub-system 110 can iteratively store charge in the memory cells 122 for the write or program operation, such as for incremental step pulse programming (ISPP). The programming step 162 (e.g., voltage step) can include an increment or a voltage value for increasing the stored charge in each iteration. The memory sub-system 110 can reach the programming level voltage 160 by incrementally storing or increasing amounts of charge corresponding to the programming step 162.

Figure 2:
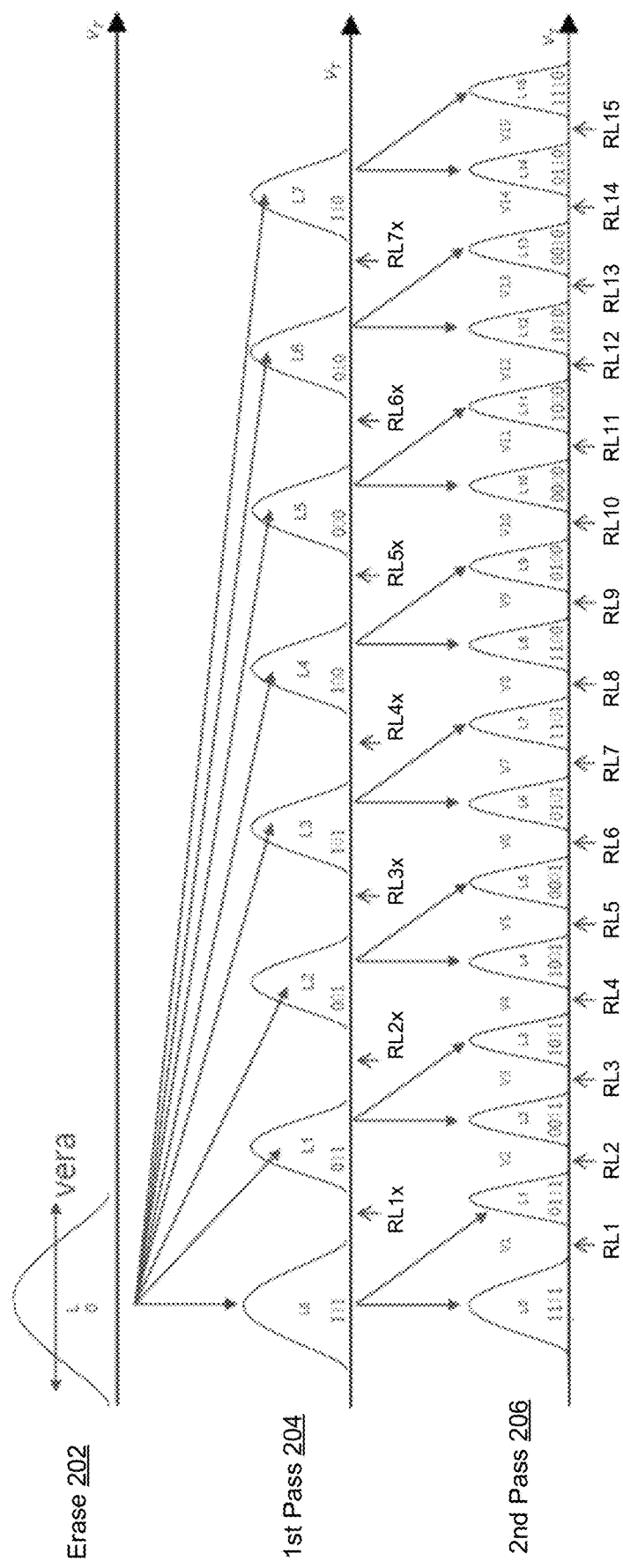
FIG. 2 is a set of graphs that illustrate an erase distribution and first and second pass programming of program verify voltage level targets according to an embodiment.

FIG. 2 is a set of graphs that illustrate an erase distribution 202, a first pass programming distribution 204, and a second pass programming distribution 206 of program verify (PV) voltage level targets according to an embodiment. In embodiments, the memory sub-system 110 receives a request from the host system 120 to perform a programming operation to store data at the QLC memory (or other memory devices having memory cells that store two or more bits). The memory sub-system 110 can first erase targeted memory cell(s) of the memory array 104, leaving the erase distribution 202 (or vera) within the voltage cells.

In one embodiment, the memory sub-system 110 can perform, subsequent to an erase operation, single pass programming, e.g., by programming (or storing data in) multiple (e.g., 16) levels at once. In another embodiment, the memory sub-system 110 can, subsequent to the erase operation, store the data by performing multi-pass programming (e.g., two or more programming passes) that programs or stores data at the memory cell(s). The multi-pass programming may program two, eight, or 16 levels at each pass of the programming. A first programming pass can program data at the memory cell at a particular time. At a later time, a second programming pass can be performed on the memory cell to store additional data at the memory cell. The second programming pass uses the information stored in the first programming pass. A certain amount of time can elapse between the memory sub-system performing the first programming pass and performing the second programming pass on the same memory cell. During a first programming pass of a two-pass programming operation, one or more voltage levels can be applied to the memory cell to program a first set of bits (e.g., 3 bits in 3 logical pages). During a second programming pass of the two-pass programming operation, one or more voltage levels can be applied to the memory cell to program an additional bit to the first set of bits (e.g., 4 bits in 4 logical pages). The level that the memory cell is programmed to in the second programming pass can be based on the last logical page of the memory cell as well as the prior logical pages that were programmed at the memory cell in the first programming pass.

A continuous read level calibration (cRLC) operation continuously samples valley margins between programming distributions. The valley margin can refer to a relative width (also referred to as "margin" herein) between pairs of adjacent programming distributions. For example, valley margins associated with a particular logical page type can indicate the relative width between pairs of programming distributions associated with the particular logical page type. For instance, a valley margin of an upper logical page (e.g., valley 2 that is between the second distribution (L1) and the third distribution (L2)) that is larger than a valley margin of the upper logical page (e.g., valley 6 that is between the sixth distribution (L5) and the seventh distribution (L6)) can indicate that valley 2 is larger than valley 3, but does not explicitly recite the absolute width or size of either valley.

Valley margin can be correlated with a read window budget (RWB). The RWB for a valley can refer to an absolute measurement in volts (e.g., millivolts (mV)) between two adjacent programming distributions. For example, the RWB for a first valley can be 270 mV and the RWB for second valley can be 250 mV. If, for example, the first valley margin is larger than the second valley margin, then a correlation that the RWB of the first valley margin is larger than the RWB of the second valley margin can be made.

Figure 3:
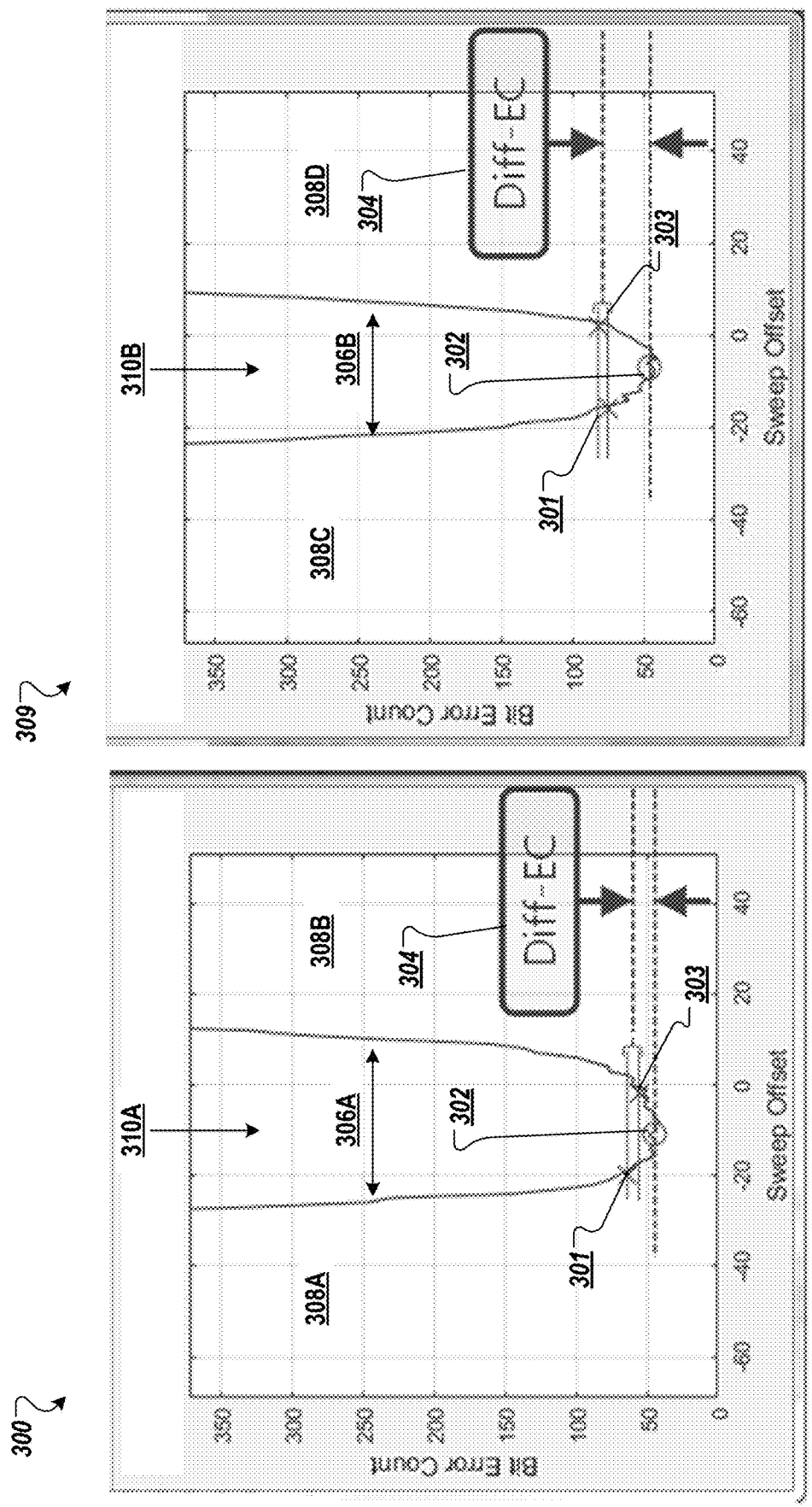
FIGS. 3A-3B are a set of graphs that illustrate difference error counts of two read level thresholds between two adjacent programming distributions, in accordance with some embodiments.

In some instances, a value for RWB is not readily measureable. A difference error count (Diff-EC) can be readily measured (e.g., by the cRLC operation) and can be correlated to a valley margin and relative RWB of valleys for a particular logical page type. Diff-EC is a metric derived from measurements taken at a valley between two adjacent programming distributions, and will be discussed in more detail with reference to FIGS. 3A-3B. In some embodiments, Diff-EC is inversely proportional to valley margin. For example, two valleys of a particular logical page type with the same Diff-EC value have approximately the same valley margin. Since the two valleys have the same valley margin, it can be inferred that the two valleys have approximately the same RWB, even though the absolute RWB is not measured. If a first valley of a first logical page type has a higher Diff-EC than a second valley of the first logical page type, it can be inferred that the first valley has less valley margin than the second valley, and that the first valley has less RWB than the second valley.

The cRLC operation is a read level calibration that can be done for each of the multiple read level threshold registers used during all read operations. A read level threshold register can store a value that indicates the read level threshold voltage for a particular valley. The cRLC operation can be performed to keep each read level threshold centered so that the memory device can achieve the best overall bit error rate (BER) possible. The cRLC operation is referred to as continuous because the operation samples continually and dynamically at discrete intervals. For example, a sample, which can be a set of three reads, can be made at about 1 sample operation in every 1 to 30 seconds, depending on the requirements. Each sample initiated by the cRLC operation returns data for a particular die and a particular logical page type so that over many of these operations the information is aggregated and fed back in a closed loop system such that each die or read level threshold is kept calibrated (e.g., the read level threshold is centered). In one implementation, a sample is three reads from the same read threshold valley (e.g., also referred to as "valley" or "Vt distribution valley" herein).

In various embodiments, the read level thresholds of the memory device can start with manufacturing default read level thresholds. The cRLC operation can be run during a test mode so that all read level offset trims of all word line groups (WLGs) of all dies in the memory system are calibrated (also referred to as "converged" herein). A memory cell (or WLG or memory device, etc.) that is calibrated or converged by cRLC has a center value that corresponds to a read level threshold (or read level trim) that is centered in or at a lowest point in the read threshold valley. A memory cell (or WLG or memory device, etc.) that is calibrated or converged by cRLC has a center value that results in a lowest bit error rate (BER). BER can refer to a ratio of a number of bits in error of a data vector divided by a total number of bits for the given data vector. BER can correspond to a particular logical page type. For example, a particular logical page type has a particular BER and another logical page type has another BER. A trim can refer to digital value that is used for a circuit, such as a register, that is converted into an analog voltage value. For example, the read level threshold trims can be programmed into a trim register, which produces a read level threshold voltage used to read data from a memory cell.

The cRLC operation measures and collects information about the valley margins, such as the center bit error count (CenterEC) and the Diff-EC measurements. CenterEC is a metric indicative of the average error count for the center sample of each trim (e.g., each read level threshold). Average CenterEC can refer to the average error count for all the read level thresholds of a particular logical page type. Average CenterEC for a particular page logical type can be indicative of a relative BER of the logical page type with respect to other logical page types. For example, a first logical page type is associated with an average CenterEC that is greater than the average CenterEC of a second logical page type. Since the first logical page type has a greater average CenterEC than the second logical page type, it can be inferred that the BER of the first logical page type is higher than the BER for the second logical page type. The cRLC measurements can also be used for various types of program targeting operations (also referred to as "Dynamic Program Targeting (DPT) operations" herein).

A program targeting (PT) operation controls the program verify (PV) target placement such that the programming distributions are placed in a beneficial arrangement. A PV target can refer to voltage value or trim value used to program a memory cell at a given level. The PV target can set a threshold voltage (Vt) (e.g., minimum voltage at which a memory cell turns on or is conductive) of the memory cell. A PV target is associated with a particular programming distribution. For example, multiple memory cells that are programmed at a particular PV target can have threshold voltages that are within the corresponding programming distribution. The programming distribution can illustrate the range of threshold voltages (e.g., normal distribution of threshold voltages) for memory cells programmed at a particular PV target. The PT operation is a PV targeting calibration that can be done for each PV target. The PT operation can be considered as a set of one or more operations to adjust or calibrate the placement of the PV targets. The PT operation calibrates multiple logical page types such that the BER of each logical page type will be approximately the same through the life of the memory system and through all operating environments (e.g., minimizes BER). Additionally, the PT operation calibrates each particular logical page type to equalize the widths of valleys of each particular logical page type such that the RWBs for the valleys of each particular logical page type are approximately the same. For example, the PT operation can adjust the three TLC logical page types; lower logical page (LP), upper logical page (UP), and extra logical page (XP) such that the BER of each of these three logical page types will be approximately the same (i.e., balanced). The PT operation uses the cRLC as the feedback metric in a closed loop feedback system. The PT operation, in addition to balancing logical page type BER, keeps the BER of each logical page type balanced dynamically by performing the PT operation during block programming, such as between the first programming pass and the second programming pass of a multi-pass programming operation on a block. Balancing the BER can reduce the average error correction trigger rate throughout the life of each die, including end-of-life (EOL) conditions. By adjusting PV targets, PT effectively moves the programming distributions in the direction of the adjusted PV targets. PT calibration (e.g., adjusting the PV targets) can result in equalization of valley margins of a particular logical page type so that the valley margins are converged at a particular convergence value and the valley margins for a particular page type are approximately equal. PT calibration can also include balancing the BER of each logical page type so that each valley associated with a particular logical page has roughly similar RWB.

The PT operation can increase endurance (i.e., increase the total Program/Erase cycles) for each die in a memory system. In an embodiment, using the PT operation avoids one logical page type dominating the end of life criteria. The PT operation can be performed independently for each word line group. The PV targets of the memory device can start with manufacturing default PV targets. The PT operation can be run during a test mode so that all PV targets of all word line groups (WLGs) of all dies in the memory system have been balanced (i.e., when the BERs of the logical page types are approximately the same). In the test mode, the cRLC and PT operations can run at an accelerated rate for a short period of time at manufacturing so that each WLG will have optimized and converged the cRLC read level thresholds prior to deployment. The cRLC and PT operations can be performed in an interleaved or concurrent method so that the memory sub-system is continually maintained at its optimum and controlled valley margin through the life of the memory sub-system.

In operational mode (e.g., when in operation in the field), the cRLC and PT operations can be run dynamically to extend the usable lifetime of the memory devices of the memory sub-system. The term "dynamic" as used herein can refer to processes, functions, operations, or implementations that occur during operation, usage, or deployment of a corresponding device, system, memory sub-system, or embodiment, and after or while running the manufacturer's or third-party firmware. The dynamically occurring processes, functions, operations, or implementations can occur after or subsequent to design, manufacture, and initial testing, setup or configuration (e.g., after test mode). In some conventional memory sub-systems, PV targets of the memory device are set with manufacturing default PV targets, and the default PV targets are not changed at any point during the life of the memory device. In other conventional memory sub-systems, some PV targets of the memory device are changed dynamically in the field. However, the PV target of the programming distribution adjacent (also referred to as the "second programming distribution" herein) to the initial programming distribution and the last programming distribution are not part of the group of PV targets that are allowed to be changed or adjusted.

The initial programming distribution (L0) (i.e., the erase distribution) is sensitive to disturb effects, such as program disturb and read disturb. For example, a read disturb is where a read of one row of memory cells impacts the threshold voltages of unread memory cells in different rows of the same block. A program disturb error occurs when one or more memory cells not intended to be programmed are changed (e.g., bits representation is changed) during a program operation on other memory cells that are proximate to the one or more memory cells. The disturb effects can cause the initial programming distribution (L0) to move up towards the adjacent programming distribution (e.g., the second programming distribution (L1)), such that the initial programming distribution (L0) and the second programming distribution (L1) overlap, which causes bit errors and reduces reliability of the memory device.

Additional available margin or RWB used to calibrate a memory cell can positively influence the endurance of the memory cell, and hence improve the endurance of the memory device. Available margin or RWB can theoretically be used to adjust programming distributions in one direction or another and make the margins between programming distributions wider (or more narrow). Having additional available margin increases the ability of the memory sub-system to adjust the PV targets of programming distributions (e.g., move programming distributions), such that margin between programming distribution is maintained over the life of the memory cell even in view of wear effects that shift or spread the programming distributions. Endurance can refer to the number of program and erase cycles a memory cell is cable of performing within the useful life of the memory cell.

For example, by allowing for the adjustment of the voltage of the initial programming distribution and the last programming distributions, the default margin between the initial programming distribution and the second programming distribution can be initially set at distance that is less than if the initial programming distribution and the second programming distribution were guard banded. As the memory cell starts to wear over time, the initial programming distribution (L0) can drift higher. The PT operation to calibrate the memory cell can compensate for the wear by moving one or more of the PV targets of the programming distributions from L1 to the last programming distribution up a same magnitude (e.g., in an "accordion-like" manner). The PT operation can continue to calibrate over the life of the memory device. Over time, similar accordion-like calibration operations can be performed until the PV target of the last programming distribution hits an upper limit (e.g., before exceeding the top voltage level limit) above which the PV target of the last programming distribution is not allowed to exceed. The PT operation can continue to calibrate the memory cell by taking margin from a valley of another logical page type and giving the margin to the valley (V1) between the initial programming distribution and the second programming distribution. By allowing the position of the initial programming distribution and the last programming distribution to be adjusted over the life of the memory device to adjust in cases when the valley between the initial programming distribution and the second programming distribution is identified as the most needy (e.g., having the lowest relative width among the valleys between the multiple programming distributions). Accordingly, the memory device is better able to compensate for wear to its memory cells, which improves endurance of the memory device.

Aspects of the disclosure address the above challenges by performing a program targeting operation to calibrate one or more PV targets associated with the programming distributions of a memory cell. In some embodiments, the PT operation determines one or more Diff-ECs that are indicative of relative widths of valleys that are located between programming distributions of a memory cell of the memory device. The Diff-ECs can be received from a cRLC operation. The processing device performs a program targeting operation on the memory cell to calibrate one or more program verify (PV) targets associated with the programming distributions. To perform the program targeting operation, the processing device selects a rule from a set of rules based on the one or more Diff-ECs. The set of rules correspond to an adjusting of a voltage (i.e., the vera) of the erase distribution, a PV target of a last programming distribution, or both.

In some embodiments, the PT operation implements the set of rules to balance the logical page types such that the BER for different logical page types is approximately the same. In selecting a rule from the set of rules, the PT operation identifies two logical page types. Each of the logical page types can have a BER, which can be inferred by an average CenterEC for each of the logical page types. If the BER of the first logical page type is less than the BER of the second logical page type, then a first subset of rules is identified from the set of rules. The first subset of rules includes rules that each give margin to the second logical page type, and take margin from the first logical page type. If the BER of the first logical page type is greater than the BER of the second logical page type, then a second subset of rules is identified from the set of rules. The second subset of rules includes rules that each give margin to the first logical page type, and take margin from the second logical page type. Using the PT operation, logical page types with higher BER are given margin from logical page types with lower BER, such that over time the PT operation balances the BER between the logical page types.

To select a particular rule from the first subset of rules, the PT operation identifies a valley of the second logical page type that has the least margin. The valley of the second logical page type that has the least margin is the valley of the second logical page type that has the highest Diff-EC (also referred to as the "most needy" valley margin). The PT operation further identifies a valley of the first logical page type that has the most margin. The valley of the first logical page type that has the most margin is the valley of the first logical page type that has the lowest Diff-EC (also referred to as the "least needy" valley margin). The PT operation can identify a rule from the first subset of rules that gives margin to the valley of the second logical page type that has the least margin of any valley of the second logical page type, and takes margin from the valley of the first logical page type that has the most margin of any valley of the first logical page type. The selected rule can identify the PV targets to be adjusted and the magnitude and direction the PV targets are to be adjusted to perform the above aforementioned. As such, the PT operation over time balances the BER between logical page types and equalizes the relative widths of the valleys for a particular logical page type.

To select a rule from the second subset of rules, the PT operation identifies a valley of the first logical page type that has the least margin. The valley of the first logical page type that has the least margin is the valley of the first logical page type that has the highest Diff-EC. The PT operation further identifies a valley of the second logical page type that has the most margin. The valley of the second logical page type that has the most margin is the valley of the second logical page type that has the lowest Diff-EC. The PT operation can identify a rule from the second subset of rules that gives margin to the valley of the first logical page type that has the least margin of any valley of the first logical page type, and takes margin from the valley of the second logical page type that has the most margin of any valley of the second logical page type. The selected rule can identify the PV targets to be adjusted and the magnitude and direction the PV targets are to be adjusted to perform the above aforementioned PT operation. As noted above, the PT operation over time balances the BER between logical page types and equalizes the relative widths of the valleys for a particular logical page type.

Being able to adjust the PV targets of the second programming distribution and the last programming distribution from the default PV targets allows the PT operation to increase the amount of available margin or RWB used to calibrate a memory cell during the memory cell's lifetime. By increasing an amount of margin or RWB available to the PT operation, the PT operation can perform additional PV target adjustments (e.g., as articulated in the set of rules described herein). The additional PV target adjustments that include adjustments to the PV targets to the second programming distribution, the last programming distribution, or both allows the memory device to better compensate for wear to its memory cells over the memory device's lifetime, which improves endurance of the memory device.

In embodiments, for the sake of illustration, rather than limitation, the PT operation is described as balancing the logical page types and equalizing the valleys of a particular logical page type as described above. It can be noted that in other embodiments, PT operations can be used to control the BER of each logical page type to be different using a scaling factor. PT operations can also be used to control the valley margins of a particular logical page type to be different using a scaling factor. Although the PT operation is described herein balancing logical page types and equalizing the valleys of a particular logical page type, aspects of the present disclosure can be used where the PT operation controls the valley margins of a particular logical page type or the BER between logical page types using a scaling factor. Further, for the sake of illustration, rather than limitation, aspects of the present disclosure are described with respect to QLC memory. It can be noted that aspects of the present disclosure can apply to any multi-bit memory, such as TLC, or other multi-bit memory.

FIGS. 3A-3B illustrate difference error counts of two read level thresholds between two adjacent programming distributions, in accordance with some embodiments of the disclosure. Graph 300 shows a valley 310A between a pair of adjacent programming distributions 308A and 308B. Graphs 309 shows a valley 310B between a pair of adjacent programming distributions. 308C and 308D. Valleys 310A-B can refer to the area between two adjacent distributions. Valley margins 306A-B can refer to a relative width or relative margin between pairs of adjacent programming distributions. One or more of programming distributions 308A-308D are generally referred to as "programming distribution(s) 308" herein. One or more of valley margins 306A-306B are generally referred to as "valley margin(s) 306" herein. One or more of valleys 310A-310B are generally referred to as "valley(s) 310" herein.

The cRLC operation samples each logical page type in each WLG. Each sample can include 3 reads: low-sample 301 (also referred to as "negative offset value" herein), center-sample 302 (also referred to as "center value" herein), and high-sample 303 (also referred to as "positive offset value" herein). As noted above, the cRLC operation calibrates or converges by obtaining a center value that results in a lowest bit error rate (BER) for a particular logical page type. Convergence is when a read level trim has the value that returns the fewest number of page or code word errors. This is what is called the calibrated or centered value and results in the best BER. In addition to finding the center of the valley 310, the cRLC operation calibrates or converges by balancing the side samples (low-Sample 301 and High-Sample 303) so that that the low-sample 301 and the high-sample 303 are equal in magnitude for a particular valley and the other valleys associated with a particular logical page type. In some embodiments, the low-sample 301 and the high-sample 303 are equal in magnitude for all the valleys for all the logical page types (or for multiple logical page types). In some embodiments, the low-sample 301 and the high-sample 303 are equal in magnitude for at least some valleys of a particular logical page type. Graph 300 and graph 309 show examples of calibrated valleys with the center samples 302 being balanced between the side samples (e.g., the 4 side samples in both graph 300 and 309 are roughly equal in magnitude). Graph 309 demonstrates wide valley behavior and graph 309 demonstrates narrow valley behavior. During cRLC sampling and updating, when the read level trims (e.g., trim registers) are centered, the value of the trim will start "dithering." Anytime a cRLC read level trim changes direction (increasing the trim value, then decreasing the trim value, and vice versa) is considered a dither. This action of dithering indicates the trim is centered. When dithering occurs for a trim, the center value will be set.

The center-samples 302 are used as feedback metrics by PT to equalize the LP/UP/XP error rates by moving PV targets slightly. For instance, the cRLC operation also obtains the center bit error count (CenterEC) by averaging the error count for the center sample of each trim (e.g., read level threshold). But, center-samples 302 are enough to equalize the BER between the logical page types (LP/UP/XP). For each logical page type, the valley margin can also have a reasonable match. The default PV targets can determine the depths of the valleys 310 between the programming distributions 308, the depths being related to valley margin 306 of each valley 310.

In various embodiments, to determine the valley margin 306 of a programming distribution 308, the cRLC operation determines values of a metric that is indicative of the width (or depth) between adjacent pairs of programming distributions 308. In some embodiments, the metric is a difference error and values of the metric are Diff-EC (also referred to as "Diff-EC measurement(s)" herein). The difference error can be inversely proportional to the valley margins. For example, as illustrated the Diff-EC of graph 300 is smaller than the Diff-EC of graph 309, and valley margin 306A of graph 300 is larger than valley margin 306B of graph 309. The cRLC operation can determine the Diff-EC measurements 304. The Diff-EC measurements 304 can be used to identify relative valley margins. The Diff-EC measurements 304 can be the mean of the two side samples 301, 303 minus the center value 302. The PT operation can perform BER leveling by moving PV targets to match not only the error counts between logical page types (e.g., balancing), but also match the valley margins within each logical page type (or within all the logical page types) (e.g., equalizing). It can also be noted that valley margin can be correlated to valley depth, e.g., from peak to trough between programming distributions. For example, a deep valley can correlate to a narrower valley margin as compared to a shallow valley (e.g., less deep valley) that correlates to a wider valley margin.

In some embodiment, the ECs of the center-samples 302 match when multiple valleys associated with logical pages are being measured (UP & XP). In various embodiments, the center-sample bit EC (also referred to as "center bit error count" or "CenterEC") can be the error count of the center-sample 302 (e.g., vertical axis of graph 300 and 309). Despite the center-sample ECs matchings, the valley margin (or depth) can be dramatically different even within the valley of different logical page types (UP & XP). To determine which valley has the largest valley margin or the smallest valley margin, the measure of Diff-EC can be reliably used. The higher the Diff-EC measurement 304, the narrower the valley margin (or the RWB is smaller). The offsets between the Low-Sample 301, Center-Sample 302, and High-Sample 303 for different Diff-EC measurements 304 are equal for purposes of comparison. In some embodiments, the cRLC operation can keep multiple samples (e.g., 16 samples) of each cRLC trim of each die. Once all the cRLC trim is centered, the center-samples 302 (and the corresponding CenterEC) and Diff-EC measurements 304 can be stored for a subsequent execution of a PT operation.

As illustrated, the example of FIG. 3A has a lower Diff-EC measurement 304 than the example of FIG. 3B, which means the programming distributions have a larger valley margin and is less-needy. The terms "more needy" and "less needy" refer to the relative valley margins of valleys which apply to the same logical page type within a WLG. In other words, the most needy valley for a logical page type will be the one that is dominating the Error Count or causing more BER loss than any other valley. The Diff-EC measurements can be used to determine more needy versus less needy valleys, including the order of neediness (most to least needy). For example, for a particular logical page type the valley with the largest Diff-EC is the most needy valley (has the smallest valley margin) of the valley(s) of the particular logical page type. In another example, for a particular logical page type the valley with the smallest Diff-EC is the least needy valley (has the largest valley margin) of the valley(s) of the particular logical page type. When a TLC page stack page BER is balanced, the LP (L3/L4) will have the lowest RWB, the UP (L1/L2 and L5/L6) will be a bit higher and should be about equal, and XP (L2/L3, L4/L5, and L6/L7) will be the highest RWB. Accordingly, the valleys of LP will have the lowest valley margins, the valleys of UP will have a bit higher valley margin, and the valleys of XP will have the highest valley margin. In various embodiments, a balanced BER causes the RWB to gravitate (e.g., equalize) to a value where the RWB for valleys of a particular logical page type are approximately the same, which occurs as a natural byproduct of the PT operation.

Figure 4:
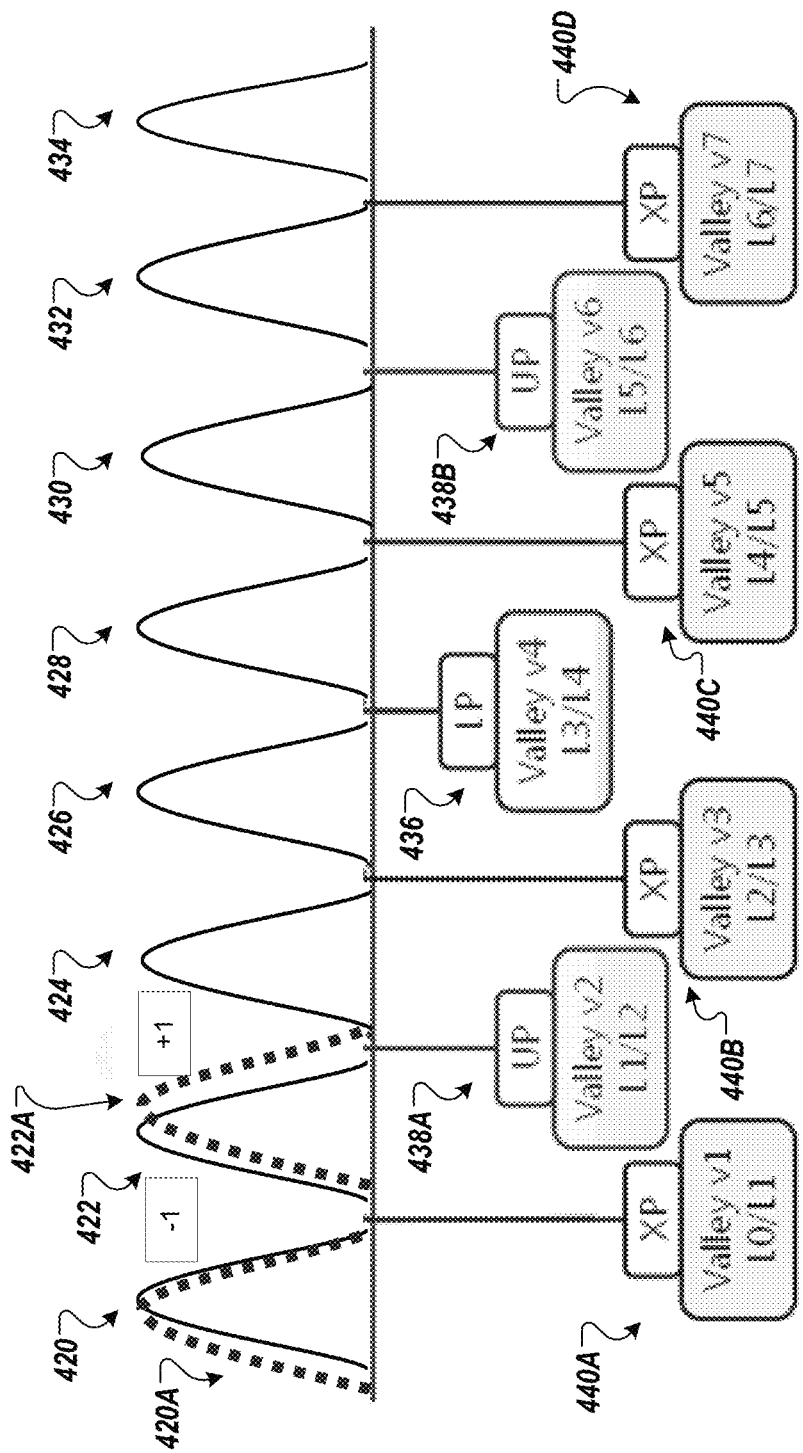
FIG. 4 is a graph that illustrates eight programming distributions, including two programming distributions after at least two of program verify targets are adjusted according to a program targeting (PT) operation, in accordance with some embodiments.

FIG. 4 illustrates eight distributions, including an erase distributions after the voltage is adjusted according to a PT operation, in accordance with some embodiments of the disclosure. As illustrated in FIG. 4, most of the data in each block is stored as TLC information, including three bits per cell. This is accomplished using an erase distribution 420 and seven programming distributions 422-434. A lower logical page (LP) is defined with one read level threshold 436 (e.g., approximately at the center between programming distributions 426 and 428). An upper logical page (UP) is defined with two read level thresholds 438A and 438B (generally referred to as "read level threshold(s) 438" herein). An extra logical page (XP) is defined with fourth read level thresholds 440A-440D (generally referred to as "read level threshold(s) 440" herein). The erase distribution and programming distributions 420-434 each correspond to a level (L0:L7), each level corresponding to a code (000: 111).

Figure 5A:
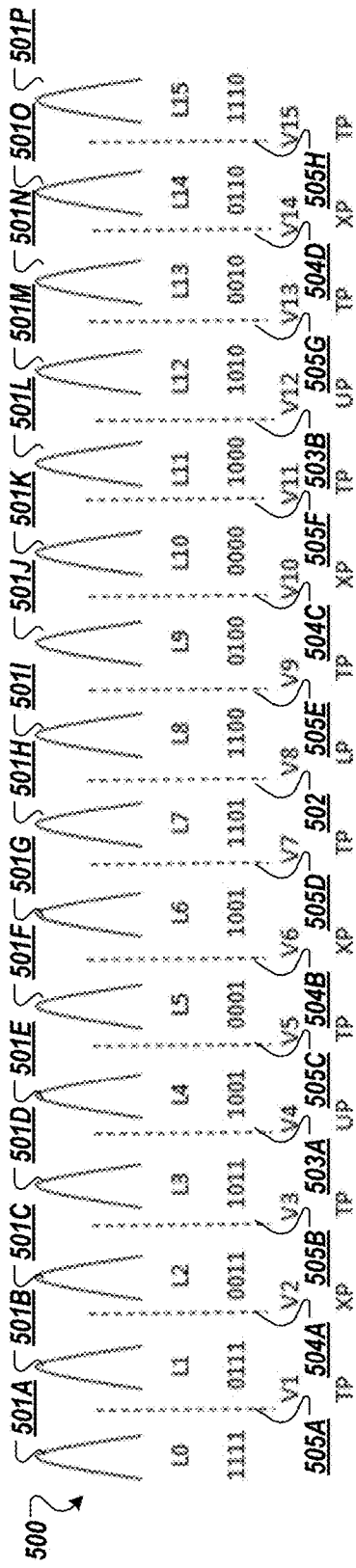
FIG. 5A illustrates an example set of rules that correspond to adjusting a voltage of an erase programming distribution and to a locking of a program verify target of a last programming distribution, in accordance with various embodiments.
Figure 5B:
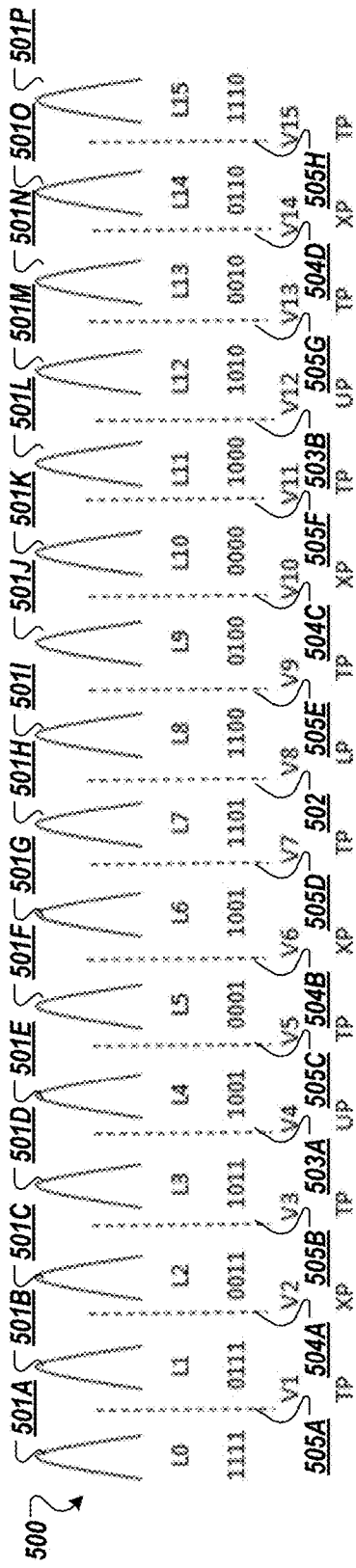
FIG. 5B illustrates an example set of rules that correspond to adjusting a voltage of an erase programming distribution last programming distribution, in accordance with various embodiments.
Figure 5C:
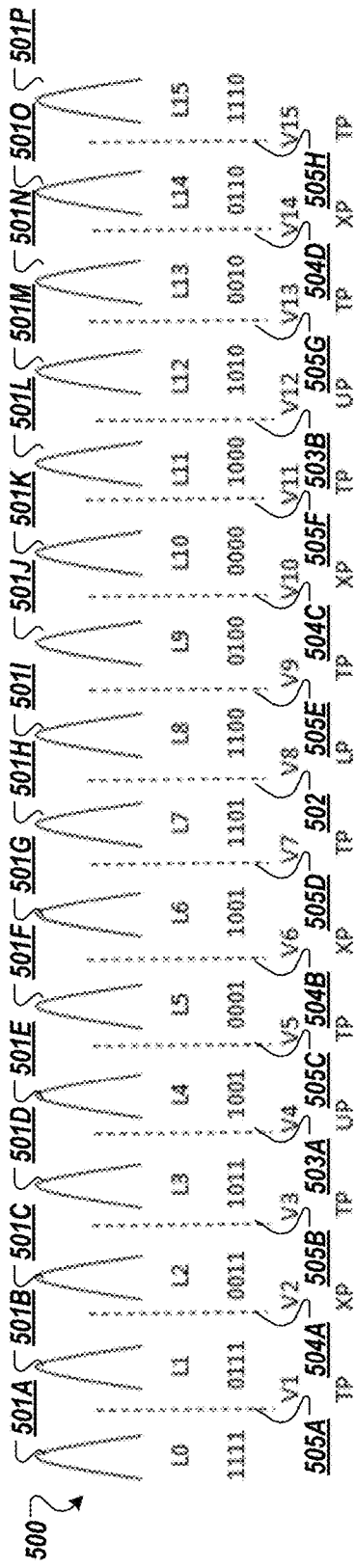
FIG. 5C illustrates an example set of rules that correspond to adjusting a voltage of an erase programming distribution, adjusting a program verify target of a last programming distribution, and a locking of a program verify target of a programming distribution adjacent to an initial programming distribution, in accordance with various embodiments.

In various embodiments, a valley exists between each pair of eight programming distributions 420-434, totaling seven valleys (v1:v7). A center or peak of each programming distribution 420-434 corresponds to a PV target for the respective programming distribution 420-432. In total, there can be eight PV targets for a 3-bit representation. In some embodiments, the erase distribution 420, corresponding to level L0, has an adjustable voltage to increase the valley margin of valley v1 when valley v1 is identified as the most needy valley. In some embodiments, the last programming distribution 434, corresponding to level L7, can have a fixed PV target and the erase distribution 420 has an adjustable PV target, as shown in FIG. 5A. In some embodiments, both the erase distribution 420 and the last programming distribution 434, corresponding to level L7, have adjustable positions, as shown in FIG. 5B. In some embodiments, the second programming distribution 422, corresponding to the second level L1, has a fixed PV target and the last programming distribution 434, corresponding to level L7, has an adjustable PV target, as shown in FIG. 5C.

Aspects of the disclosure allow an adjustment of the voltage of the erase distribution 420 when a valley between the programming distribution adjacent to the erase distribution (e.g., programming distribution 422) is identified as a most needy valley (e.g., valley V1 has the smallest valley width, highest DiffEC and highest BER). Using PT operations, the voltage of the erase distribution and, in some cases, the PV targets of additional programming distributions corresponding to levels L1-L7, can be adjusted. In FIG. 4, the programming distribution 420 has the lowest voltage level and is associated with the lowest PV target, and programming distribution 422 has the second lowest voltage level and the second lowest PV target. Programming distribution 434 has the highest voltage level and the highest PV target.

In the depicted embodiment, the PT operation starts with each PV target in a default state as defined by factory settings. In some cases, the voltage associated with the erase distribution can be adjusted to produce the adjusted erase distribution 420A (denoted by the dashed line in FIG. 4). In some embodiments, the second PV target of the second programming distribution (L1) and the last PV target of the last programming distribution (L7) can be fixed, allowing the intervening PV targets to be adjusted. For example, with eight PV targets (of L0-L7), the L7 PV target can be fixed and the other PV targets L1 through L6 can receive characterized starting values, leading to faster cRLC and PT operation conversion. Alternatively, the L1 PV target can be fixed and the other PV targets L2-L7 can be adjusted. These factory settings of the PV targets and read level thresholds can produce undesirable BER results before cRLC and PT operations.

In some embodiments, the PT operation is defined as a net-zero PV target adjustment mechanism. Net-zero adjustments maintain a constant RWB for a memory cell. The total RWB for a memory cell of a multi-bit memory cell is constant, but the RWB between programming distributions can be adjusted by changing PV targets. Net-zero adjustments manages PV target adjustments for optimum BER and logical page type BER matching. The PT operation performs PV target adjustments in order to balance logical page type BER for improved BER sigma continuously throughout the life of a memory device or memory system. The PT operation, as described herein, can be performed between programming passes of a multi-pass programing operation, such as after a first programming pass or a second programming pass. The cRLC calibration is performed in order to perform a subsequent PT operation. The cRLC measures and collects center bit error count (CenterEC) and Diff-EC information on the page stack and passes the information to a subsequent PT operation. Both cRLC and PT can be performed while a block is being programmed rather than after a block is fully programmed.

In embodiments, during programming of the selected block used for PT, the programming sequence is interrupted to perform cRLC. Programming interruption occurs at each logical page stack (selected as one of the cRLC logical page stacks). A logical page stack can refer to all the logical page types for a particular multi-bit memory cell. The program interruption occurs just before the second-pass programming when the first-pass distributions have fully aggressed floating gate coupling from their neighbors. During block programming each of the cRLC page stacks in each of the wordline groups is interrupted and a cRLC is performed until all read level thresholds of the page stack are centered. The cRLC information from each valley, CenterEC and Diff-EC, is passed to the PT operation for determining PV target adjustments according to the PT rules. PV target adjustments are applied to the next block that is programmed and this process of interrupting and cRLC/PT continues as PT converges and finally dithers and then tracks NAND behavior. As noted above, by adjusting PV targets, PT effectively moves the programming distributions in the direction of the adjusted PV targets. PT calibration (e.g., adjusting the PV targets) can result in valley margins of a particular logical page type to converge at a particular convergence value so that the valley margins for a particular logical page type are roughly the same. PT calibration can include balancing the BER of each logical page type so that each logical page type has roughly similar BER. During PT PV target adjustment, when that value of the PV trim starts "dithering" (anytime a PV trim changes direction (increasing the trim value, then decreasing the trim value, and vice versa) is considered a dither), the PT operation for the respective programming distribution has converged.

A program target offset is defined as the difference in position of a PV distribution relative to the default starting value. For example, the PV targets for L2 and L3 first slew to the right by a certain amount (e.g., by about 130 mv) and then stop slewing and start dithering, which is stabilization (or calibrated). The valley after L3 is the L3/L4 valley (v4), the center value of which is the read level threshold 436 (corresponding to the LP Read Level). This movement is caused by equalizing the BER of the LP page with respect to other logical pages. All PV targets can be stabilized after a number of P/E cycles (e.g., ~40 P/E cycles). It can take some time to stabilize the PV targets as the operation alternates between LP/UP and LP/XP adjustments with a maximum movement of 1 click (e.g., 10 mv). It is possible to characterize these offsets in many die, producing a head start set of offsets, providing BER equalization at time zero.

As described herein, BER balancing can be performed as a net-zero adjustment. As illustrated in FIG. 4, one voltage step (e.g., 10 mv or some other voltage step) is given to one level (e.g., labeled as +1) and one voltage step (10 mv) is taken from another level (e.g., labeled as −1). In the example shown in FIG. 4, one voltage step is taken from the erase distribution level (L0) and one voltage step is given to the second programming level (L1) 422A to increase the margin between L0 and L1 by two voltage steps (e.g., 20 mv or some other multiple of another voltage step). According to embodiments, the shifts do not need to be integer-based, such that if the desired outcome of the PT operation is to maintain a margin of 1 between L0 and L1, L0 can be moved −0.5 and L1 can be moved +0.5. PT operations can adjust both UP and XP (and TP in QLC memory) relative to LP, resulting in BER balancing and RWB equalization of all three TLC logical page types (or all four logical page types in QLC memory). In various embodiments, it is possible to give more RWB to higher distributions if required for undesirable NAND behavior like retention for example.

FIG. 5A illustrates an example set of rules that correspond to an adjusting of a voltage of an erase distribution (L0) and to a locking of a PV target of a last programming distribution (L15), in accordance with embodiments of the disclosure. Diagram 500 illustrates the erase distribution (L0) and programming distributions (L1-L15) of a QLC memory. The data in each block is stored as QLC information, including 4 bits per cell. This is accomplished using sixteen programming distributions 501A through 501P (generally referred to as "programming distributions 501"). A lower logical page (LP) is defined with one read level threshold 502 (e.g., approximately at the center between programming distributions 501H and 501I). An upper logical page (UP) is defined with two read level thresholds 503A and 503B (generally referred to as "read level threshold(s) 503" herein). An extra logical page (XP) is defined with four read level thresholds 504A-504D (generally referred to as "read level threshold(s) 504" herein). A top logical page (TP) is defined with eight read level thresholds 505A-505H (generally referred to as "read level threshold(s) 505" herein). The sixteen programming distributions 501A-501P each correspond to a level (L0:L15), each level corresponding to a code (0001:1111).

In some embodiments, the code represents gray code. Gray code refers to a binary numeral system were two successive valleys differ in only one bit (e.g., binary digit). It can be noted that, in other embodiments, a different gray code can be used. Between each pair of sixteen programming distributions 501A-501P is a valley, totaling fifteen valleys (V1:V15). Each of the valleys (V0:V15) are located between two adjacent programming distributions. For example, valley one (V1) is located between programming distributions 501A and 501B, and valley fifteen (V15) is located between programming distributions 5010 and 501P. Each of the read level thresholds is centered in a corresponding valley (V1:V15). For example, read level threshold 502 is centered in valley eight (V8), read level threshold 505A is centered in valley one (V1), and so forth. A center or peak of each programming distribution 501A-501P corresponds to a PV target for the respective programming distribution 501A-501P. In total, there can be sixteen PV targets for a 4-bit representation. In some embodiments, the first programming distribution 501A, corresponding to the first level L0, has a fixed PV target. The second programming distribution 501B, corresponding to the second level L1, has fixed PV target and the last programming distribution 501P, corresponding to the sixteenth level L15, has an adjustable PV target. In some embodiments, the last programming distribution 501P, corresponding to the sixteenth level L15, can have a fixed PV target and second programming distribution 501B, corresponding to the second level L1, has and adjustable PV target. In some embodiments, both the second programming distribution 501B, corresponding to the second level L1, and the last programming distribution 501P, corresponding to the sixteenth level L15, have adjustable PV targets.

Aspects of the present disclosure allow a voltage of the erase distribution (L0) to be adjusted using a set of rules, as described herein. Using PT operations, the PV targets of the intervening programming distributions, corresponding to levels L1-L15, can be adjusted. Diagram 500 illustrates increasing voltage levels from left to right. For example, a programming distribution adjacent to the erase distribution corresponding to a lowest PV target is also referred to as the "second programming distribution" herein. A programming distribution (e.g., programming distribution 501P) corresponding to a highest PV target is also referred to the as the "last programming distribution" herein.

Set of rules 510 illustrates rules where the voltage of the erase distribution is allowed to move, the second programming distribution (L1) is allowed to move, and the last programming distribution (L15) is locked. It can be understood that the movement of the voltage of the erase distribution and the movement of a PV target associated with a particular programming distribution effectively moves the erase and programming distributions in the same direction and in equal magnitude that the voltage and PV target are moved. The set of rules 510 illustrate rules for performing a programming target operation (e.g., PT calibration). The set of rules 510 allows the program targeting operation to move the voltage of the erase distribution and identify which PV targets to move, if any, and in which direction and magnitude to move the identified PV targets. As noted above, the program targeting operation implements the set of rules to balance logical page types such that a bit error rate (BER) is approximately the same BER for different logical page types, and to equalize relative widths of valleys of a particular logical page type such that read window budgets (RWB) for the valleys of the particular logical page type are approximately a same RWB.

BER equalization can be performed as a net-zero adjustment. The program targeting operation can adjust UP, XP, and TP relative to LP, resulting in equalization of all four QLC logical page types. For example, the valley margin for the LP can be reduced by one voltage step (e.g., −10 mV) and a valley margin of the XP can be increased by one voltage step (+10 mV) (or vice versa), such that a net-zero adjustment is performed. The column 511 illustrates set of rules are for TP-LP adjustments, such that that the TP is adjusted relative to the LP in a net-zero adjustment as described above. The set of rules 510 includes sixteen rules illustrated by cases 1-16. Note that rules and cases are used interchangeably herein. In QLC memory, the TP page corresponds to the second programming distribution and the last programming distribution, the PV target adjustments for which are addressed in cases 1-16 of the set of rules 510. It can be noted that for TLC memory, the XP corresponds to the second programming distribution and the last programming distribution. A set of rules for XP-LP in TLC memory that adjust the second programming distribution and the last programming distribution corresponding to the XP of the TLC memory can be implemented in accordance with aspects of the disclosure. In disclosed embodiment, a QLC memory is described for purposes of illustration, rather than limitation. Aspects of this disclosure can also apply to different multi-bit memory cells, such as TLC memory or the like.

In some embodiments, to perform a program targeting operation to calibrate one or more PV targets associated the programming distributions 501 of a memory cell, a rule from set of rules 510 can be selected. The rule can identify which PV targets to adjust and the magnitude and direction of the adjustment (e.g., ±10 mV). It can be noted that the operations described with respect to FIG. 5A can be performed by the program targeting component 113 as illustrated in FIG. 1A. In some embodiments, to select a rule from the set of rules, the program targeting component 113 identifies that the valley between L0 and L1 is the most needy (per column 512) and adjusts the voltage of the erase distribution (L0), as denoted by the −1 in table 510.

In an example shown in case number 1 of table 510, the program targeting component 113 can identify that the valley of the TP has the highest Diff-EC (e.g., V1) as compared to the other valleys. In addition, the program targeting component 113 can also determine a valley (V8) of the LP has the lowest Diff-EC (e.g., note that LP is associated with only one valley, which can considered the valley of LP with the highest or lowest Diff-EC). A rule that increases the valley margin for V1 by increasing the voltage of the erase distribution (L0) while locking the PV target of L8 can be identified from the set of rules 510. The selected rule can identify the PV targets to adjust and the magnitude and direction of the adjustment, and program targeting component 113 can adjust the PV targets according to the identified rule.

In some embodiments, to select a rule from the set of rules 510, the program targeting component 113 identifies a first logical page type and a second logical page type. For example, in a QLC memory the program targeting component 113 can identify the TP and the LP. In some embodiments, for QLC memory the program targeting component 113 can identify the two logical page types as one of the following: TP-LP, XP-LP, and UP-LP. It can be noted that in some embodiments, the selection of the two logical page types can be based on a particular order. For example, the program targeting component 113 can adjust the TP-LP, followed by the XP-LP, followed by UP-LP, and so forth. It can also be noted that different sets of rules can be used for XP-LP, and UP-LP.

In some embodiments, to select a rule from the set of rules 510, the program targeting component 113 determines whether a BER for the first logical page type (e.g., LP) is less than or greater than a BER for the second logical page type (e.g., TP). In some embodiments, to determine whether the BER for the first logical page type is less than or greater than the BER for the second logical page type, program targeting component 113 compares a first average center bit error count (CenterEC) for the first logical page type to a second average center bit error count (CenterEC) for the second logical page type. The average CenterEC for a particular page type is indicative of the BER of the particular logical page type. In an example, the average CenterEC of the LP can be compared to the average CenterEC of the TP. The BER for the first logical page type (e.g., LP) is less than the BER for the second logical page type (TP) if the first average CenterEC is less than the second average CenterEC. The BER for the first logical page type (e.g., LP) is greater than the BER for the second logical page type (e.g., TP) if the first center bit error count (e.g., average CenterEC) is greater than the second center bit error count (e.g., CenterEC).

In some embodiments, responsive to determining that the BER for the first logical page type (e.g., LP) is less than the BER for the second logical page type (e.g., TP), program targeting component 113 identifies a first subset (e.g., LP<TP) of the set of rules 510. The selected rule is from the first subset of rules. For example, column "Average CenterEC" illustrates a first subset of the rules (e.g., cases 1-8) to apply when the BER (e.g., lower average CenterEC) of the LP is less than the BER (e.g., higher average CenterEC) for the TP.

In some embodiments, responsive to determining that the BER for the first logical page type (e.g., LP) is greater than the BER for the second logical page type (e.g., TP), program targeting component 113 identifies a second subset (e.g., TP<LP) of the set of rules 510. The selected rule is from the second subset of rules. For example, column "Average CenterEC" illustrates a second subset of the rules (e.g., cases 9-16) to apply when the BER (e.g., higher average CenterEC) of the LP is greater than the BER (e.g., lower average CenterEC) for the TP.

In some embodiments, subsequent to identifying the subset of rules, program targeting component 113 can select a rule from the identified subset of rules. In some embodiments, to identify the rule from the first subset of rules (e.g., cases 1-16), the program targeting component 113 identifies a rule from the first subset of rules based on a valley (V8) that has a most margin for the first logical page type (e.g., LP) and a valley that has a least margin for the second logical page type (e.g., TP). In some embodiments, one or more difference error counts are used to determine the valley that has the most margin for the first logical page type (e.g., LP) and the valley that has the least margin for the second logical page type (e.g., TP).

In some embodiments, to identify the rule from the second subset of rules (e.g., cases 21-28), program targeting component 113 identifies a rule from the second subset of rules based on a valley that has the most margin for the second logical page type (e.g., TP) and a valley that has the least margin for the first logical page type (e.g., LP). In some embodiments, one or more difference error counts are used to determine the valley that has the most margin for the second logical page type (e.g., TP) and the valley that has the least margin for the first logical page type (e.g., LP).

Column 512 and column 513 of set of rules 510 illustrated "Neediness" of valleys for a particular logical page type. Neediness is based on the Diff-EC measurement. A lower Diff-EC measurement for a particular valley of a logical page type means that the particular valley has a larger valley margin and is less-needy that another valley of the same logical page type that has a higher Diff-EC measurement. The terms "More needy" and "Less needy" refer to the relative valley margins of valleys of the same logical page type. In other words, the most needy valley for a logical page type will be the one that is dominating the Error Count (CenterEC) or causing more BER loss than any other valley of the same logical page type. The Diff-EC measurements can be used to determine more needy versus less needy valleys, including the order of Neediness (most to least needy). For example, for a particular logical page type the valley with the largest Diff-EC is the most needy valley (e.g., has the smallest valley margin) of the valley(s) of the particular logical page type. In another example, for a particular logical page type the valley with the smallest Diff-EC is the least needy valley (e.g., has the largest valley margin) of the valley(s) of the particular logical page type.

As noted above, the program targeting operation calibrates a memory cell by balancing the logical page types such that the BER is approximately the same between the logical page types. To balance the BER, some of the RWB of a logical page type that has a lower BER will be given to a different logical page type with a higher BER. In the case 1 example shown in FIG. 5A, the voltage of the erase distribution is lowered to increase the margin of the most needy valley of the logical page type that has the higher BER (e.g., L1) will be increased in a net-zero adjustment. It can be noted that the since the BER of the LP is less than the BER of the TP, the first subset of the set of rules include rules that give RWB to the TP, and take RWB from the LP in a net-zero adjustment. In cases where the BER of the LP is greater than the BER of the TP, the second subset of rules include rules that give RWB to the LP, and take RWB from the TP in a net-zero adjustment.

In an example, program targeting component 113 identifies the LP and the TP as the two logical page types on which to perform a program targeting operation. Program targeting component 113 identifies the set of rules 510 that apply to performing a program targeting operation on the LP and TP logical page types (e.g., LP-TP Update). The program targeting component 113 determines that the BER for the LP is less than the BER for the TP. In order to make the aforementioned determination, the program targeting component 113 determines the average CenterEC for the LP is less than the average CenterEC for the TP. The average CenterEC for the LP being less than the average CenterEC for the LP indicates that the BER for the LP is less than the BER for the TP. By determining that average CenterEC is for the LP is less than the average CenterEC for the TP, program targeting component 113 identifies a first subset (e.g., LP<TP, which identifies cases 1-8) of the set of rules 510 that apply if the BER for the LP is less than the BER for the TP. To identify a specific rule from cases 9-20, program targeting component 113 identifies the most needy valley of the TP and the least needy valley of the LP. The most needy valley of the TP is the valley that has the least relative width (e.g., the least margin) and the highest Diff-EC of the all the valleys of the TP. The least needy valley of the LP is the valley that has the largest relative width (e.g., the most margin) and the lowest Diff-EC for all the valleys of the LP. In a particular instance, valley one (V1) of the TP has the highest Diff-EC of all the valleys of the TP and is the Most Needy valley, and valley eight (V8) of the LP has the lowest Diff-EC of all the valleys of the LP and is the Least Needy valley. In the aforementioned condition, column 513 can be identified as the rule in the first subset of set of rules 510 to apply (e.g., see columns 512 and 513 indicating most needy valley and least needy valley combinations).

In case 1 of set of rules 510, one voltage step (e.g., 10 mv) is taken from the erase distribution (labeled as −1) and one voltage step (e.g., 10 mv) is given to the PV targets of programming distributions L1:L7 (e.g., labeled as +1). The programming distributions L1:L7 are moved in an accordion-like manner, such that all the PV targets of programming distributions (L1:L7) are moved in the same direction and same magnitude. It can be noted that in case 1, RWB is given to valley 1 (V1) of the TP as PV target of the programming distribution L1 is moved to the right and the erase distribution is moved to the left. Valleys V2:V7 experience no change in relative width (or RWB) since all the PV targets for programming distributions L1:L7 shift to right by the same magnitude and direction (e.g., to the right by +10 mV). The corresponding valleys V2:V7 shift to the right a corresponding amount, but do not change in relative width. RWB is taken from valley 8 (V8) of the LP as the PV target of programming distribution L7 is moved to the right and the PV target of programming distribution L8 remains stationary. Valley 8 (V8) of the LP is squeezed to give margin to valley 1 (V1) of the TP in a net-zero adjustment.

In an embodiment, case 9 of the set of rules 510, is the opposite of case 1. In case 9, the BER of the LP is greater than the BER of the TP. The most needy valley of the LP is valley 8 (V8) of the LP, and the least needy valley of the TP is valley 1 (V1). In case 9, one voltage step (e.g., 10 mv) is taken from the erase distribution and from the PV targets of programming distributions L1:L7 (e.g., labeled as −1). The programming distributions L1:L7 are moved in an accordion-like manner, such that the erase distribution (L0) and the PV targets of programming distributions (L1:L7) are moved in the same direction and same magnitude. It can be noted that in case 9, RWB is taken from valley 1 (V1) of the TP as the PV target of the programming distribution L1 is moved to the left. Valleys V2:V7 experience no change in relative width (or RWB) since the erase distribution and the PV targets for programming distributions L1:L7 shift in the same direction and by the same magnitude (e.g., left by −10 mV). The corresponding valleys V2:V7 simply shift to the left a corresponding amount, but do not change in relative width. RWB is given to valley 8 (V8) of the LP as the PV target of programming distribution L7 is moved to the left (e.g., 10 mV) and the PV target of programming distribution L8 remains stationary. Valley 1 (V1) of the TP is reduced to give margin to valley 8 (V8) of the LP in a net-zero adjustment.

In an embodiment, the set of rules 510 are rules where programming distribution L15 is locked such that the PV target of programming distribution L15 is not adjusted by the program targeting operation. The blank spaces that are placed in the column designated by "L15" are used to illustrate that PV targets of programming distribution L15 are not allowed to be adjusted during a program targeting operation according to the set of rules 510.

FIG. 5B illustrates a set of rules that correspond to an adjusting of a PV target of a last programming distribution and a locking of a PV target of a programming distribution adjacent to an initial programming distribution, in accordance with embodiments of the disclosure. Diagram 500 of FIG. 5A is provided to help illustrate FIG. 5B. Set of rules 520 can be similarly implemented to set of rules 510, unless otherwise described. Set of rules 520 shows a set of rules where a position of the erase distribution can be moved and the PV target of the second distribution (L1) and the last distribution (L15) are allowed to be adjusted. In embodiments, set of rules 520 can be implemented as an alternative to other sets of rules for cases 1-16, as described herein. A couple of rules (i.e., cases) of set of rules 520 are described below to help illustrate implementations using set of rules 520.

In case 1 of set of rules 520, the BER of the LP is less than the BER of the TP. The Most Needy valley 512 of the TP is valley v1, and the least needy valley 513 of the LP is valley v8. One voltage step (e.g., −10 mv) is taken to the voltage of the erase distribution to provide additional margin to the most needy valley v1. The programming distributions L1:L7 are moved in an accordion-like manner, such that all the PV targets of the programming distributions (L1:L7) are moved in the same direction and same magnitude.

In an embodiment, in case 8, RWB is given to no valley, but the programming distribution (L15) is given additional margin away from the top voltage level limit. Moving programming distribution L15 to the left (−10 mV) gives additional margin between programming distribution L15 and the top voltage level limit. Valleys V9:V15 experience no change in relative width (or RWB) since all the PV targets for programming distributions L8:L15 shift to left by the same magnitude and direction (e.g., to the left by −10 mV). The corresponding valleys V9:V15 shift to the left a corresponding amount, but do not change in relative width. RWB is taken from valley 8 (V8) of the LP as the PV target of programming distribution L8 is moved to the left and the PV target of programming distribution L7 remains stationary. Valley 8 (V8) of the LP is reduced to give margin between the last programming distribution of the TP and the top voltage level limit in a net-zero adjustment.

In FIG. 5B, it can be noted that case 16 of set of rules 520, is the opposite of case 8. In case 16, the BER of the LP is greater than the BER of the TP. The most needy valley of the LP is valley 8 (V8), and the least needy valley of the TP is valley 15 (V15). In case 16, one voltage step (e.g., +10 mv) is given to the PV targets of programming distributions L8:L15 (e.g., labeled as +1). The programming distributions L8:L15 are moved in an accordion-like manner, such that all the PV targets of programming distributions L8:L15 are moved in the same direction and same magnitude. It can be noted that in case 16, RWB is taken from margin between programming distribution L15 and the top voltage level limit as PV target of the programming distribution L15 is moved to the right. Valleys V9:V15 experience no change in relative width (or RWB) since all the PV targets for programming distributions L8:L15 shift in the same direction and by the same magnitude (e.g., right by +10 mV). RWB is given to valley 8 (V8) of the LP as the PV target of programming distribution L8 is moved to the right (e.g., +10 mV) and the PV target of programming distribution L7 remains stationary. The margin between programming distribution L15 of the TP and the top voltage level limit is squeezed to give margin to valley 8 (V8) of the LP in a net-zero adjustment.

In FIG. 5B, it can be further noted that set of rules 520 include rules (e.g., for cases 1 and 9) where programming distribution L1 and L15 are not locked, but adjustments are made to the position of the erase distribution to provide additional margin to the most needy valley (e.g., valley v1 in case 1 and valley v8 in case 9). The blank spaces in the various column of table 520 are used to illustrate that PV targets of the corresponding programming distributions are not adjusted during a program targeting operation.

FIG. 5C illustrates a set of rules that correspond to cases where a voltage of an erase distribution and a PV target of a last programming distribution are adjustable, while a PV target of a second programming distribution (L1) is locked, in accordance with embodiments of the disclosure. Diagram 500 of FIG. 5A is provided to help illustrate FIG. 5C. The set of rules 530 can be similarly implemented to the set of rules 510 or the set of rules 520, unless otherwise described. The set of rules 530 shows a set of rules where the PV target of the second distribution (L1) is locked and the voltage of the erase distribution and the PV target of the last distribution (L15) are allowed to be adjusted. A couple of rules (i.e., cases) of set of rules 530 are described below to help illustrate implementations using set of rules 530. According to rule 1, based on a determination that valley v1 is the most needy, the voltage of the erase distribution is reduced (as denoted by the −1 in the table 530) to increase the valley margin of valley v1. Similarly, in case 9, based on a determination that valley v8 is the most needy valley and valley v1 is the least needy valley, the voltage of the erase distribution is reduced.

Figure 6:
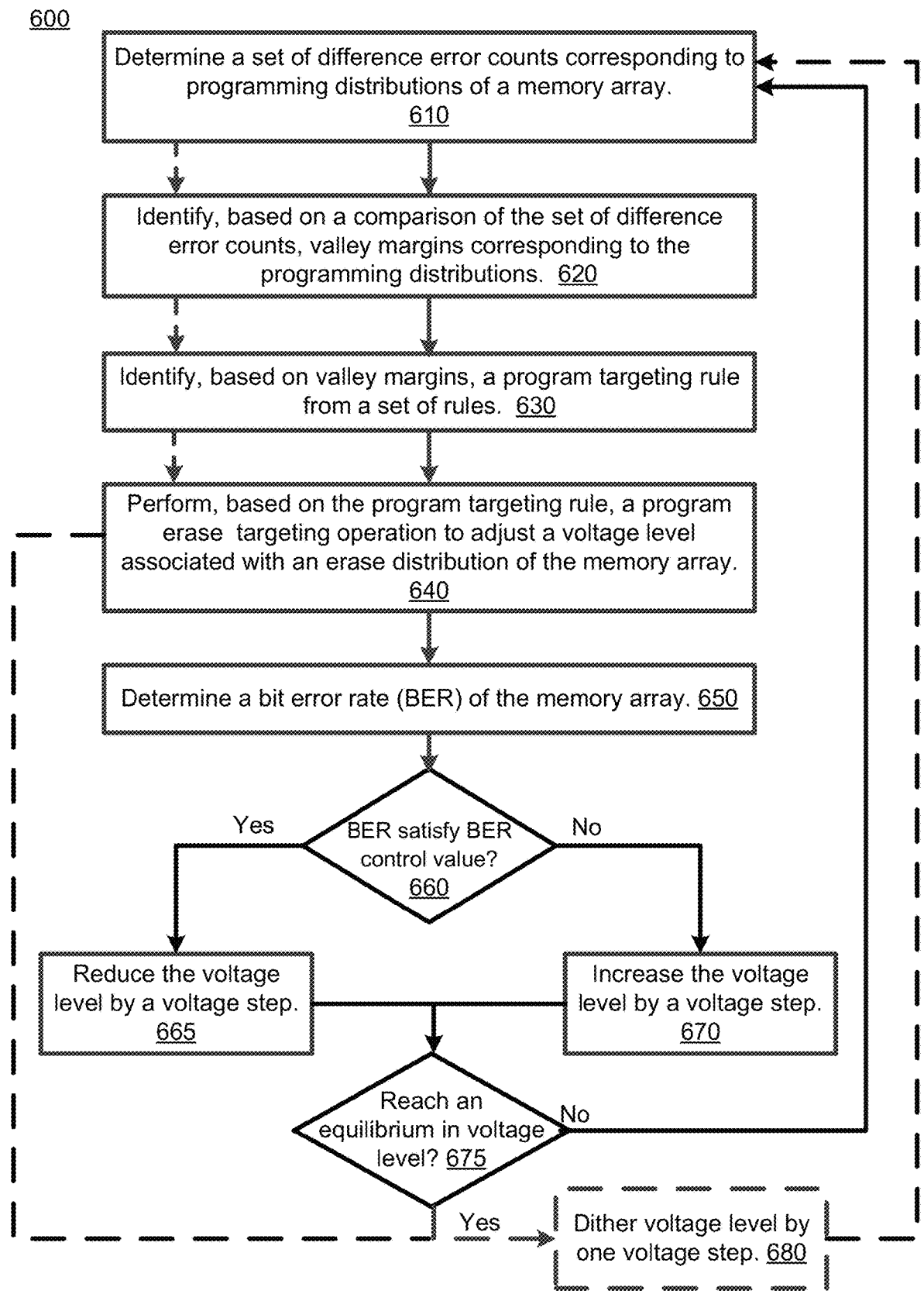
FIG. 6 is a flow diagram of an example method for execution of dynamic program erase targeting with bet error rate (BER) according to various embodiments.

FIG. 6 is a flow diagram of an example method 600 for execution of dynamic program erase targeting with bet error rate (BER) according to various embodiments. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the controller 115 (e.g., program targeting component 113) of FIG. 1A and optionally with other logic of the memory sub-system 110. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Before the start of the method 600, e.g., as an initial pre-operation, the processing logic can perform an erase, a program, a cRLC operation, and a read with factory default trim values. The processing logic can then measure the BER in order to establish a baseline BER, which can be used in determining a BER control value of which to compare future BER measurements.

At operation 610, the processing logic determines a set of difference error counts (e.g., Diff-EC) corresponding to multiple programming distributions of the memory array (610). In some embodiments, to determine one or more difference error counts for a difference error, the processing logic performs a cRLC operation on the memory cell to calibrate read level thresholds between the programming distributions.

At operation 620, the processing logic identifies, based on a comparison of the set of difference error counts, valley margins corresponding to the programming distributions. In an embodiment, the programming distribution adjacent to the erase distribution (i.e., the second programming distribution or L1 as shown in FIG. 4) is identified as the most needy (i.e., has the lowest relative valley margin) based on a comparison of the difference error counts corresponding to the respective programming distributions. In an embodiment, a valley associated with a lower page (LP) is identified as having the lowest valley margin (i.e., the most needy valley), such as the valley between programming distribution L7 and programming distribution L8 based on a comparison of the difference error counts corresponding to the respective programming distributions. In an embodiment, the processing device determines that the valley between the erase distribution (L0) and the second programming distribution (L1) (i.e., valley v1) has the highest relative difference error count and as a result represents the most needy valley.

At operation 630, the processing logic selects, based on values of the valley margins, a program targeting rule from a set of rules. In some embodiments, to select the rule from the set of rules based on the values of the valley margins, processing device selects the rule from the set of rules that identifies the at least two program verify (PV) targets describing an adjusting such that a relative width of a valley that has a lowest difference error count (Diff-EC) of the valleys of a first logical page type is decreased and a relative width of a valley that has a highest Diff-EC of the valleys for a second logical page type is increased. Selecting a rule from a set of rules is further described with respect to FIG. 7 and FIG. 5A through FIG. 5C.

At operation 640, the processing logic performs, based on the program targeting rule, a program erase targeting operation to adjust a voltage level associated with an erase distribution of the memory array. In an embodiment, the program erase targeting operation calibrates the memory cells of the memory array by adjusting the voltage level of the erase distribution and one or more PV targets associated with the other programming distributions (e.g., L1-L15), as discussed with reference to FIG. 3A through FIG. 5C. In one embodiment, performing the program erase targeting operation includes reducing the voltage level associated with the erase distribution to increase a margin of the valley between the erase distribution and the programming distribution adjacent to the erase distribution. In another embodiment, performing the program erase targeting operation includes increasing the voltage level associated with the erase distribution to decrease a margin of the valley between the erase distribution and the programming distribution adjacent to the erase distribution. In various embodiments, adjustment of the erase distribution voltage level may be performed once every number of adjustments to the one or more PV targets of other programming distributions (e.g., L1-L15), e.g., once in 10, 20, 25, or the like adjustments to such PV targets.

At operation 650, the processing logic determines a bit error rate (BER) of the memory array. The BER can be calculated from the number of bit errors detected in an error correction code (ECC) codeword divided by the total number of bits in the codeword. The calculated BER can include the bit error count of a single codeword, the mean or median of multiple codewords, or can include only the codewords of a specific page or page type.

At operation 660, the processing logic determines whether the BER satisfies a BER control value. In one embodiment, the processing logic also, before placing the system into operation, determines a baseline BER based on factory default trim values, sets the BER control value as a percentage above the baseline BER. The BER control value can be set by a customer or a manufacturer in different embodiments, and can be reprogrammed at a later time to drive the acceptable BER in the control loop of FIG. 6 to a different BER control value.

At operation 665, the processing logic, in response to the BER satisfying a BER control value, reduces the voltage level of the erase distribution by a voltage step. Satisfying the BER control value can include to be greater than the BER control value. In contrast, at operation 670, the processing logic, in response to the BER not satisfying the BER control value, increases the voltage level by the voltage step. In embodiments, not satisfying the BER includes being less than or equal to the BER control value.

At operation 675, the processing logic determines whether the voltage level of the erase distribution has reached an equilibrium. An equilibrium can be detected as the voltage level moving one direction for a while (e.g., increasing) and then starts to move back the opposite direction (e.g., decreasing), or begins to vacillate around a voltage level within a range of the voltage level. If the voltage level has not reached the equilibrium, the processing logic can continue to repeat the control loop defined by program targeting operations 610 through 660. This control loop (back through the program targeting operations of the method 600) can include performing each loop after execution of between tens to hundreds of program/erase cycles of the memory cells.

At operation 680, if the voltage level of the erase distribution has been reached the equilibrium, the processing logic can dither the voltage level to change between plus or minus one voltage step during each subsequent loop after reaching the equilibrium in the voltage level. The subsequent loops (after equilibrium has been reached) are illustrated in a dashed line for clarity, where operations 610 through 640 are repeated between dithering the voltage level between plus/minus one voltage step. In this way, the equilibrium in the voltage level of the erase distribution is maintained while additional programming targeting updates are performed to one or more valley margins to the programming distributions.

FIG. 7 is a flow diagram of an example method 700 for execution of a memory quality test using one or more read voltage levels according to various embodiments. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by the controller 115 (e.g., program targeting component 113 of FIG. 1A) and optionally with other logic of the memory sub-system 110. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Before the start of the method 700, e.g., as an initial pre-operation, the processing logic can perform an erase, a program, a cRLC operation, and a read with factory default trim values. The processing logic can then measure the BER in order to establish a baseline BER, which can be used in determining a BER control value of which to compare future BER measurements.

At operation 710, the processing logic presets, to higher than a default value, a voltage level of an erase distribution of a memory array. The memory array includes memory cells of a first logical page type and of a second logical page type, for example. In an example, the first logical page type and the second logical page type are different logical page types. For example, in QLC memory the first logical page type can be an LP and the second logical page type can be a TP, or vice versa. Presetting the voltage level of the erase distribution to a higher voltage is to cause a reduced first valley (V1) margin between the erase distribution and the level one (L1) distribution (see FIGS. 2, 4). The higher voltage in turn results in a higher BER for the page type that includes this valley, and normally results in the method 700 branching through operation 770 rather than operation 765, as discussed in more detail below.

At operation 720, the processing logic determines a set of difference error counts corresponding to a plurality of programming distributions of the first logical page type. In one embodiment, operation 720 is the same or similar to operation 610 (FIG. 6). The operation 720 may also be viewed as the first of multiple program targeting operations of a control loop, as will be discussed kin more detail.

At operation 730, the processing logic identifies, based on a comparison of the set of difference error counts, a plurality of valley margins corresponding to the programming distributions. In one embodiment, operation 730 is the same or similar to operation 620 (FIG. 6).

At operation 740, the processing logic adjusts, multiple times, a value of at least some of the valley margins to equalize relative valley margins of the first logical page type such that read window budgets (RWB) for valleys of the first logical page type are approximately the same RWB. The multiple times may be a preset number of DPT updates, such as three, five, six, or the like. While operation 740 focuses on equalizing RWB for valleys of the first logical page type, the operation 740 can also, or alternatively, include equalizing RWB for valleys of the second logical page type. Equalizing RWB for valleys via adjusting the width of valley margins was discussed in detail with reference to FIG. 2 through FIG. 5C. Further, while operation 740 focuses on equalizing RWB for valleys of the first logical page type, the operation 740 can also, or alternatively, include balancing BER between the first and second logical page types such that the BER of each of these logical pages types is approximately the same. Balancing BER between logical page types was also discussed in detail with reference to FIG. 2 through FIG. 5C.

At operation 750, the processing logic determines a bit error rate (BER) of the memory array. The BER can be calculated from the number of bit errors detected in an error correction code (ECC) codeword divided by the total number of bits in the codeword. The calculated BER can include the bit error count of a single codeword, the mean or median of multiple codewords, or can include only the codewords of a specific page or page type.

At operation 760, the processing logic determines whether the BER satisfies a BER control value. In one embodiment, the processing logic also, before placing the system into operation, determines a baseline BER based on factory default trim values, sets the BER control value as a percentage above the baseline BER. The BER control value can be set by a customer or a manufacturer in different embodiments, and can be reprogrammed at a later time to drive the acceptable BER in the control loop of FIG. 7 according to a different BER control value.

At operation 765, the processing logic reduces the voltage level by a voltage step in response to the BER satisfying the BER control value. Satisfying the BER control value can include to be greater than the BER control value. In contrast, at operation 770, the processing logic, in response to the BER not satisfying the BER control value, increases the voltage level by the voltage step. In embodiments, not satisfying the BER includes being less than or equal to the BER control value.

At operation 775, the processing logic determines whether the voltage level of the erase distribution has reached an equilibrium. An equilibrium can be detected as the voltage level moving one direction for a while (e.g., increasing) and then starts to move back the opposite direction (e.g., decreasing), or begins to vacillate around a voltage level within a range of the voltage level. If the voltage level has not reached the equilibrium, the processing logic can continue to repeat the control loop defined by the program targeting operations 720 through 770 (assuming, in one embodiment, that operation 765 is skipped because the BER in each loop does not satisfy the BER control value). This control loop (back through the program targeting operations of method 700) can include performing each loop after execution of between tens to hundreds of program/erase cycles of the memory cells.

In some embodiments, the repeating of this control loop (operations 720 through 770) can further be performed with reference to the second logical page type, and can further include, in some embodiments, balancing, each of the multiple times of adjusting valley margins, the BER between the first logical page type and the second logical page type.

At operation 780, if the voltage level of the erase distribution has been reached the equilibrium, the processing logic can dither the voltage level to change between plus or minus one voltage step during each subsequent loop after reaching the equilibrium in the voltage level. The subsequent loops (after equilibrium has been reached) are illustrated in a dashed line for clarity, where program targeting operations 720 through 740 are repeated between dithering the voltage level between plus/minus one voltage step. In this way, the equilibrium in the voltage level of the erase distribution is maintained while additional programming targeting updates are performed to one or more valley margins to the programming distributions.

Figure 8:
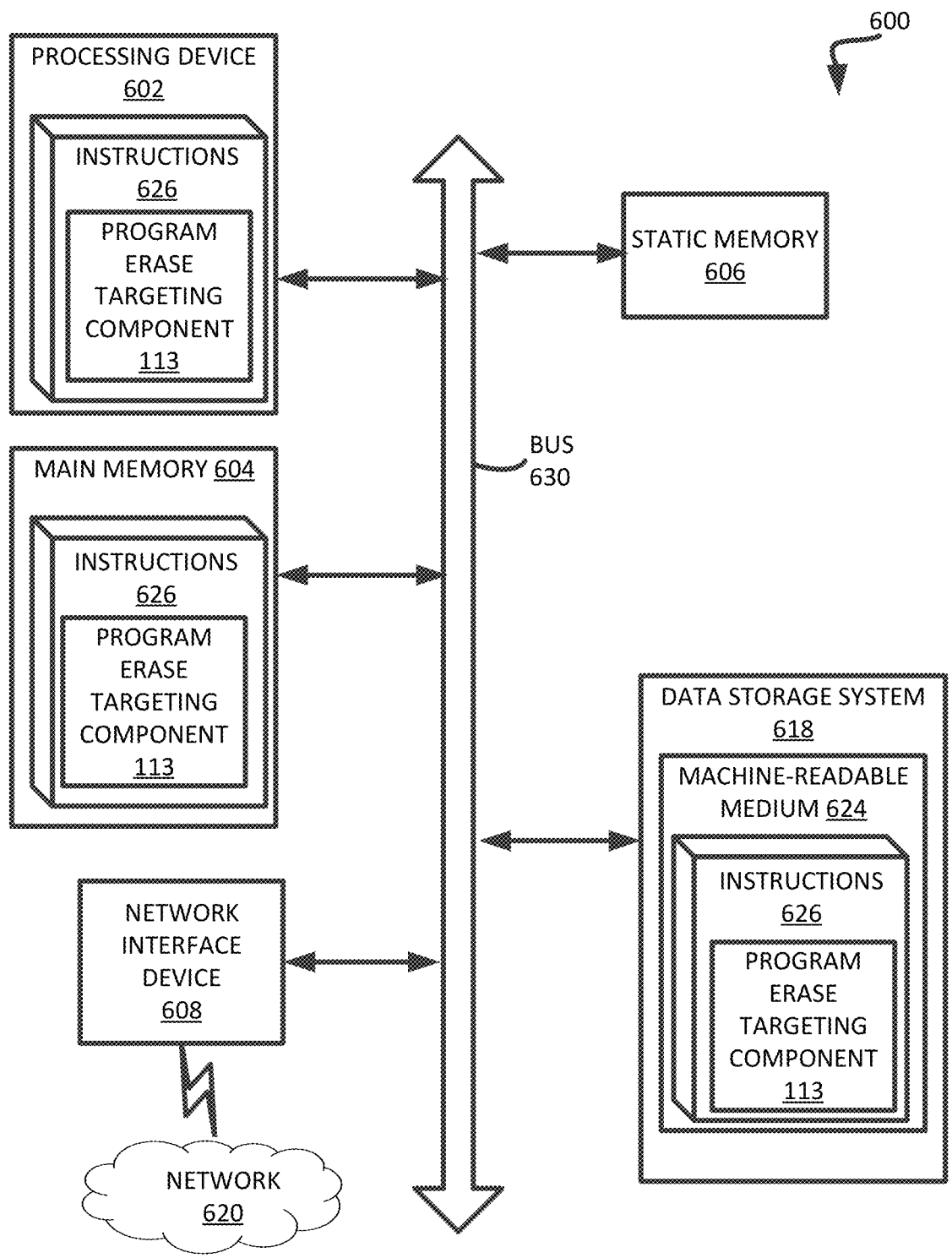
FIG. 8 is a block diagram of an example computer system in which embodiments of the present disclosure can operate.

FIG. 8 illustrates an example machine of a computer system 800 within which a set of instructions, for causing the machine to perform any one or more of the methodologies discussed herein, can be executed. In some embodiments, the computer system 800 can correspond to a host system (e.g., the host system 120 of FIGS. 1A-1B) that includes, is coupled to, or utilizes a memory sub-system (e.g., the memory sub-system 110 of FIGS. 1A-1B) or can be used to perform the operations of a controller 115 (e.g., to execute an operating system to perform operations corresponding to the program targeting component 113 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein. The computer system 800 can further include a network interface device 808 to communicate over the network 820.

The data storage system 818 can include a machine-readable storage medium 824 (also known as a computer-readable medium) on which is stored one or more sets of instructions 826 or software embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory sub-system 110 of FIGS. 1A-1B.

In one embodiment, the instructions 826 include instructions to implement functionality corresponding to an error determining component (e.g., the program targeting component 113 of FIG. 1A). While the machine-readable storage medium 824 is shown in an example embodiment to be a single medium, the term "non-transitory machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory array including a plurality of memory cells; and
a processing device coupled to, and to perform program targeting operations for, the memory array, wherein to perform the program targeting operations, the processing device is to:
determine a set of difference error counts corresponding to a plurality of programming distributions of the memory array;
identify, based on a comparison of the set of difference error counts, a plurality of valley margins corresponding to the plurality of programming distributions;
select, based on values of the plurality of valley margins, a program targeting rule from a set of rules;
perform, based on the program targeting rule, a program erase targeting operation to adjust a voltage level associated with an erase distribution of the memory array;
determine a bit error rate (BER) of the memory array;
in response to the BER satisfying a BER control value, reduce the voltage level by a voltage step; and in response to the BER not satisfying the BER control value, increase the voltage level by the voltage step.

2. The system of claim 1, wherein the processing device is further to, before placing the system into operation, determine a baseline BER based on factory default trim values, wherein the processing device is further to set the BER control value as a percentage above the baseline BER.

3. The system of claim 1, wherein the processing device is further to:
repeat, as a loop, the program targeting operations until reaching an equilibrium in the voltage level; and
dither the voltage level to change between plus or minus one voltage step during each subsequent loop after reaching the equilibrium in the voltage level.

4. The system of claim 3, wherein the processing device is to perform each loop after execution of between tens to hundreds of program/erase cycles of the plurality of memory cells.

5. The system of claim 1, wherein the BER is based on one of a single codeword or a mean or a median of multiple codewords.

6. The system of claim 1, wherein the program targeting rule comprises locking of a program verify (PV) target of a programming distribution corresponding to a highest PV target.

7. The system of claim 1, wherein the processing device is further to adjust, based on the program targeting rule, one or more program verify (PV) targets of one or more of the plurality of programming distributions.

8. The system of claim 1, wherein the program erase targeting operation is to implement the program targeting rule to further balance logical page types such that the BER is approximately a same BER for different logical page types, and to equalize relative valley margins of a particular logical page type such that read window budgets (RWB) for valleys of the particular logical page type are approximately a same RWB.

9. A method comprising:
presetting, by a processing device to higher than a default value, a voltage level of an erase distribution of a memory array, the memory array comprising a plurality of memory cells of a first logical page type and of a second logical page type; and
performing, by the processing device, program targeting operations comprising:
determining a set of difference error counts corresponding to a plurality of programming distributions of the first logical page type;
identifying, based on a comparison of the set of difference error counts, a plurality of valley margins corresponding to the plurality of programming distributions;
adjusting, multiple times, a value of at least some of the plurality of valley margins to equalize relative valley margins of the first logical page type such that read window budgets (RWB) for valleys of the first logical page type are approximately a same RWB;
determining a bit error rate (BER) of the memory array; and
increasing the voltage level by a voltage step in response to the BER not satisfying a BER control value.

10. The method of claim 9, further comprising:
determining a baseline BER based on factory default trim values before placing a memory device into operation that comprises the memory array; and
setting the BER control value as a percentage above the baseline BER.

11. The method of claim 9, wherein the multiple times comprises a preset number of updates, the method further comprising:
repeating, as a loop, the program targeting operations until reaching an equilibrium in the voltage level;
reducing, during any given loop, the voltage level by the voltage step in response to the BER satisfying the BER control value; and
dithering the voltage level to change between plus or minus one voltage step during each subsequent loop after reaching the equilibrium in the voltage level.

12. The method of claim 11, wherein repeating the program targeting operations as a loop comprises performing each loop after execution of between tens to hundreds of program/erase cycles of the plurality of memory cells.

13. The method of claim 9, further comprising, before performing v) and vi):
repeating, each of the multiple times, the program targeting operations for the second logical page type; and
balancing, each of the multiple times, the BER between the first logical page type and the second logical page type.

14. The method of claim 13, further comprising:
repeating, as a loop, the program targeting operations until reaching an equilibrium in the voltage level;
reducing, during any given loop, the voltage level by the voltage step in response to the BER satisfying the BER control value; and
dithering the voltage level to change between plus or minus one voltage step during each subsequent loop after reaching the equilibrium in the voltage level.

15. A non-transitory computer-readable storage medium comprising instructions that, when executed by a processing device, cause the processing device to perform program targeting operations comprising:
determining a set of difference error counts corresponding to a plurality of programming distributions of a memory array, the memory array comprising a plurality of memory cells;
identifying, based on a comparison of the set of difference error counts, a plurality of valley margins corresponding to the plurality of programming distributions;
selecting, based on values of the plurality of valley margins, a program targeting rule from a set of rules;
performing, based on the program targeting rule, a program erase targeting operation to adjust a voltage level associated with an erase distribution of the memory array;
determining a bit error rate (BER) of the memory array;
reducing the voltage level by a voltage step in response to the BER satisfying a BER control value; and
increasing the voltage level by the voltage step in response to the BER not satisfying the BER control value.

16. The non-transitory computer-readable storage medium of claim 15, wherein the program targeting operations further comprise:
determining a baseline BER based on factory default trim values before placing a memory device into operation that comprises the memory array; and
setting the BER control value as a percentage above the baseline BER.

17. The non-transitory computer-readable storage medium of claim 15, wherein the program targeting operations further comprise:

repeating, as a loop, the program targeting operations until reaching an equilibrium in the voltage level; and dithering the voltage level to change between plus or minus one voltage step during each subsequent loop after reaching the equilibrium in the voltage level.

18. The non-transitory computer-readable storage medium of claim 17, wherein repeating the program targeting operations as a loop comprises performing each loop after execution of between tens to hundreds of program/erase cycles of the plurality of memory cells.

19. The non-transitory computer-readable storage medium of claim 15, wherein a valley having a lowest valley margin of the plurality of valley margins is between the erase distribution and a programming distribution adjacent to the erase distribution, and wherein performing the program erase targeting operation comprises reducing the voltage level associated with the erase distribution to increase a margin of the valley between the erase distribution and the programming distribution adjacent to the erase distribution.

20. The non-transitory computer-readable storage medium of claim 15, wherein a valley having a lowest valley margin of the plurality of valley margins is between the erase distribution and a programming distribution adjacent to the erase distribution, and wherein the program targeting operations further comprise determining that the valley having the lowest valley margin is associated with a highest difference error count of the set of difference error counts.

* * * * *